US 8,541,731 B2

(12) United States Patent
Sugawa et al.

(10) Patent No.: US 8,541,731 B2
(45) Date of Patent: Sep. 24, 2013

(54) SOLID-STATE IMAGE SENSOR

(75) Inventors: Shigetoshi Sugawa, Sendai (JP);
Yasushi Kondo, Kyoto (JP); Hideki Tominaga, Uji (JP)

(73) Assignees: Shimadzu Corporation, Kyoto (JP);
Tohoku University, Miyagi (JP)

( * ) Notice: Subject to any disclaimer, the term of this patent is extended or adjusted under 35 U.S.C. 154(b) by 202 days.

(21) Appl. No.: 12/996,613

(22) PCT Filed: Jun. 10, 2009

(86) PCT No.: PCT/JP2009/002604
§ 371 (c)(1),
(2), (4) Date: Dec. 6, 2010

(87) PCT Pub. No.: WO2009/150828
PCT Pub. Date: Dec. 17, 2009

(65) Prior Publication Data
US 2011/0084197 A1    Apr. 14, 2011

(30) Foreign Application Priority Data
Jun. 10, 2008 (JP) ................................. 2008-151161

(51) Int. Cl.
*H01L 27/146* (2006.01)
*H04N 5/335* (2011.01)

(52) U.S. Cl.
USPC .......................... 250/208.1; 348/294; 348/302

(58) Field of Classification Search
USPC ............... 250/208.1, 214.1, 214 R; 348/294, 348/295, 297, 302, 308, E5.091
See application file for complete search history.

(56) References Cited

U.S. PATENT DOCUMENTS

| 2002/0163491 A1 | 11/2002 | Yoshimura et al. ............. 345/90 |
| 2007/0285544 A1 | 12/2007 | Yamada et al. ................ 348/294 |
| 2011/0085066 A1* | 4/2011 | Sugawa et al. ................ 348/302 |

FOREIGN PATENT DOCUMENTS

| JP | 2001-292379 | 10/2001 |
| JP | 2001-345441 | 12/2001 |

(Continued)

OTHER PUBLICATIONS

Yasushi Kondo et al., "Development of "Hyper-Vision HPV-1" High-speed Video Camera", Technology Research Lab., Shimadzu Review, Sep. 30, 2005, vol. 62, No. 1-2, pp. 79-86.

(Continued)

*Primary Examiner* — Kevin Pyo
(74) *Attorney, Agent, or Firm* — Bingham McCutchen LLP

(57) ABSTRACT

A pixel output line is provided for each of the pixels two-dimensionally arrayed in a pixel area. The pixel output lines are extended to a memory area, and a memory unit is connected to each of those lines. The memory unit includes a writing-side transistor, a reading-side transistor and a plurality of memory sections for holding signals for 104 image frames. A photocharge storage operation is simultaneously performed at all the pixels, and the thereby produced signals are outputted to the pixel output lines. In the memory unit, with the writing-side transistor in the ON state, the sampling transistor of a different memory section is sequentially turned on for each exposure cycle so as to sequentially hold a signal in the capacitor of each memory section. After a burst imaging operation is completed, all the pixel signals are sequentially read. Unlike CCDs, the present device does not simultaneously drive all gate loads, so that it can be driven at high speeds with low power consumption. Thus, the burst imaging can be performed at higher speeds than ever before.

18 Claims, 14 Drawing Sheets

(56) References Cited

FOREIGN PATENT DOCUMENTS

| | | |
|---|---|---|
| JP | 2002-512461 | 4/2002 |
| JP | 2005303621 A | 10/2005 |
| JP | 2006-245522 | 9/2006 |
| JP | 2007-259428 | 10/2007 |
| JP | 2007-329722 | 12/2007 |
| WO | WO 01/78006 A1 | 10/2001 |
| WO | WO 2009/031301 A1 | 3/2009 |

OTHER PUBLICATIONS

Japanese language office action dated Jan. 24, 2012 and its English language translation issued in corresponding Japanese application 2010516754.

Korean language office action dated May 1, 2012 and its English language translation issued in corresponding Korean application 1020107029675.

Japanese language international preliminary report on patentability dated Dec. 14, 2010 and its English language translation for corresponding PCT application PCT/JP2009/002604.

Japanese language office action dated Aug. 14, 2012 and its English language translation issued in corresponding Japanese application 2010516754.

Extended European search report dated Nov. 16, 2012 issued in corresponding European application 09762259.1.

Chinese language office action dated Oct. 9, 2012 and its English language translation issued in corresponding Chinese application 200980121963.4.

Chinese Office Action dated Jun. 24, 2013 for the related Chinese Patent App. No. 200980121963.4.

English translation of "Reason for Rejection" of Chinese Office Action dated Jun. 24, 2013 for the Chinese App. No. 200980121963.4.

\* cited by examiner (a) CONTINUOUS READING MODE (ONE FRAME ONLY)

(b) CONTINUOUS READING MODE (REPEATED)

(c) BURST READING MODE

SOLID-STATE IMAGE SENSOR

CROSS-REFERENCE TO THE RELATED APPLICATIONS

This application is a national stage of international application No. PCT/JP2009/002604, filed on Jun. 10, 2009, and claims the benefit of priority under 35 USC 119 to Japanese Patent Application No. 2008-151161 filed on Jun. 10, 2008, the entire contents of which are incorporated herein by reference.

TECHNICAL FIELD

The present invention relates to a solid-state image sensor and, more specifically, to a solid-state image sensor capable of high-speed operations suitable for taking images of high-speed phenomena, such as destructions, explosions or combustions.

BACKGROUND ART

High-speed imaging devices (high-speed video cameras) for taking consecutive images of high-speed phenomena, such as explosions, destructions, combustions, collisions or discharges, for only a short period of time have been conventionally developed (for example, refer to Non-Patent Document 1 and other documents). Such high-speed imaging devices need to perform an ultrahigh-speed imaging operation that exceeds a level of approximately one million frames per second. Accordingly, they use solid-state image sensors capable of high-speed operations, which have special structures different from those of the imaging sensors conventionally used in normal video cameras, digital cameras and similar devices.

One example of this type of solid-state image sensor is disclosed in Patent Document 1 and other documents. The devices disclosed in those documents are referred to as an in-situ storage image sensor (IS-CCD). An outline of this image sensor is as follows.

In this in-situ storage image sensor, a storage CCD for a specified number of record frames is provided for each photodiode functioning as a photo-receiver. This CCD also serves for transferring signals. During an imaging operation, pixel signals produced by photoelectric conversion by the photodiode are sequentially transferred to the storage CCD. After the imaging operation is completed, the pixel signals corresponding to the specified number of record frames stored in the storage CCD are collectively and sequentially read, and the images corresponding to the specified number of record frames are reproduced outside the image sensor. During the imaging operation, pixel signals exceeding the specified number of image frames are discarded from the oldest ones. Thus, the latest set of pixel signals corresponding to the specified number of frames are always held in the storage CCD. This means that, when the transfer of pixel signals to the storage CCD is suspended at the completion of the imaging operation, one can obtain the latest series of images ranging from the completion of the imaging operation back through a period of time corresponding to the specified number of record frames.

Thus, unlike general types of image sensors that require pixel signals to be extracted every time a set of pixel signals corresponding to one frame is obtained, the in-situ storage image sensor is characterized by its capability of acquiring a plurality of consecutive images at extremely high speeds. However, the in-situ storage image sensor has the following problems.

(1) The aforementioned in-situ storage image sensor structurally requires a large amount of power. This is because the gate electrodes and signal lines, both having high capacitive loads, must be simultaneously driven during the process of transferring signal charges to the CCD, and also because the voltage amplitude of the gate-driving signal is large. Attempting to increase the drive speed for higher imaging speeds would additionally increase the power consumption and possibly cause heat generation that exceeds the upper limit of heat radiation. Furthermore, the high capacitive load may cause waveform distortion of the drive signal (e.g. dulling of the waveform), in which case the attempt of increasing the drive speed may totally prevent the charge transfer.

(2) In the conventional in-situ storage image sensor, the storage CCDs are located between the neighboring photodiodes on a semiconductor chip. Therefore, when a large amount of photocharges are generated by an incidence of strong light onto a photodiode, some of the photocharges may flow into the storage CCD. As a result, various problems can occur, such as the deterioration of signal-to-noise (S/N) ratio of the images. In the worst case scenario, the image will be ghosted.

(3) Even during the stand-by period for the next signal-reading cycle, the storage CCDs receive false signals due to dark charges. This may possibly lower the S/N ratio of the images.

On the other hand, in the field of CMOS image sensors, a device disclosed in Patent Document 2 has been known. In this image sensor, a plurality of capacitors acting as memory elements are provided within each pixel so that the photocharges generated by the photodiode can be consecutively stored, for each frame, in a different set of memory capacitors. Although this device can continuously record a few to several frames, it cannot perform the continuous imaging operation over such a large number of frames that the aforementioned high-speed imaging device is intended for. Using more memory capacitors to increase the number of continuously recordable frames results in a higher capacitive load of the signal lines extending from the detection node storing the charges generated by the photodiode, which makes it difficult to raise the operation speed. Furthermore, the area of the photodiode within each pixel inevitably decreases, which lowers the aperture ratio and accordingly deteriorates the sensitivity.

PRIOR ART DOCUMENTS

Patent Documents

Patent Document 1: Japanese Unexamined Patent Application Publication No. 2001-34544
Patent Document 2: Japanese Unexamined Patent Application Publication (Translation of PCT Application) No. 2002-512461

Non-Patent Document

Non-Patent Document 1: Kondo et al., "Kousokudo Bideo Kamera HyperVision HPV-1 no Kaihatsu (Development of "HyperVision HPV-1" High-Speed Video Camera)", *Shimadzu Hyouron (Shimadzu Review)*, Shimadzu Hyouron Henshuu-bu, Sep. 30, 2005, Vol. 62, No. 1/2, pp. 79-86

DISCLOSURE OF THE INVENTION

Problems to be Solved by the Invention

In view of the previously described problems, the applicant of the present patent application has proposed a CMOS image sensor with a new configuration in the International Patent Application No. JP2008/002425. This type of image sensor requires not only the basic components (e.g. a photoelectric conversion section for producing voltage signals according the intensity of incident light, and memory sections for holding voltage signals for a plurality of frames) but also switching elements (e.g. transistors), bus lines for simultaneously reading signals from all pixels, and other elements. However, increasing the number of bus lines or the number of transistors, capacitors or other elements of the memory section causes some problems, such as a decrease in the aperture ratio of the pixel section, an increase in the pixel pitch or an increase in the size of the memory section, so that it will be difficult to reduce the chip size. For example, if it is demanded to improve image resolution without changing the chip size, reduce the chip size to improve the yield ratio of the production process, or increase the aperture ratio to improve the photosensitivity without changing the chip size, it is desirable to reduce the area occupied by the lines provided in the pixel section or make the memory section as small as possible.

The present invention has been developed in view of this problem, and its primary objective is to provide a solid-state image sensor that can perform burst imaging (i.e. a continuous imaging operation without signal-reading steps) at ultra-high speeds, and yet with low power consumption, while minimizing the numbers of basic components, lines and other elements to make the chip size smaller.

Means for Solving the Problems

A solid-state image sensor according to the present invention aimed at solving the previously described problem is characterized by including:

a) a pixel area in which a plurality of pixels are arranged, each pixel including a photoelectric conversion element for receiving light and generating photocharges, a transfer element for transferring the photocharges generated by the photoelectric conversion element to a detection node for converting a charge signal into a voltage signal and a buffer element for sending an output signal from the detection node to a pixel output line; and b) a memory area, which is separated from the pixel area and includes a plurality of memory sections for each of the pixels in order to hold signals produced by each pixel over a plurality of frames, and having a writing-side gate element and a reading-side gate element on the pixel output line connecting each pixel and the plurality of memory sections corresponding to this pixel, the writing-side gate element being located between the pixel and the plurality of memory sections, and the reading-side gate element being located on a memory-section side across the writing-side gate element.

The solid-state image sensor according to the present invention has a CMOS structure. The photoelectric conversion element is, for example, a photodiode, more preferably an embedded photodiode. The detection node is, for example, a diffusion layer in a floating state (i.e. a floating diffusion). The transfer element may be a transistor. The buffer element may be a source follower amplifier consisting of one or more transistors. The writing-side gate element and the reading-side gate element may also each consist of one transistor.

In the solid-state image sensor according to the present invention, a voltage signal corresponding to electric charges obtained by storing photocharges generated by the photoelectric conversion element of each pixel can be sequentially held, for each frame, in a plurality of memory sections via the writing-side gate element. Since the plurality of memory sections are provided for each pixel, it is possible to continuously acquire as many analogue signals as the memory sections. After the acquiring process is completed, the signals can be sequentially read from the memory sections to the outside via the reading-side gate element and then processed.

In the solid-state image sensor according to the present invention, although a plurality of memory sections corresponding to each pixel is provided inside the sensor, it is unnecessary to simultaneously drive all the gate loads when holding new signal charges as in the case of the conventional in-situ storage image sensor using a storage CCD. Therefore, it has low power consumption and generates less heat even when driven at high speeds. Furthermore, since the pixel area and memory area are separated, the number of memory sections corresponding to one pixel can be increased without affecting other design factors, e.g. the number of pixels in the pixel area, the area of the light-receiving surface of the photoelectric conversion element, or the entire size of the pixel area. Accordingly, it is possible to ensure an adequately large number of frames for high-speed burst imaging.

Even if an excessive amount of photocharges are generated by an incidence of strong light onto the photoelectric conversion element, the photocharges cannot reach the memory sections since the pixel area and memory area are separated. The generation of dark charges during the stand-by period until the next signal-reading cycle can be avoided by designing the memory sections so that they holds signals by a capacitor having a double polysilicon structure or stack structure. These techniques improve the S/N ratio of the signals, which enhances, for example, the quality of the images reproduced from the read signals.

In the solid-state image sensor according to the present invention, the memory sections may each consists of one capacitor and one switch element, where the switch can be formed by one transistor.

In this configuration, a system for holding N frames of image signals can be created by providing N pairs of transistors and capacitors accompanied by one transistor as the writing-side gate element and another transistor as the reading-side gate element. The sharing of the writing-side gate element and the reading-side gate element among a large number of memory sections reduces the number of elements within the memory area, so that the space of the memory area required for providing the memory capacity corresponding to the same number of frames can be reduced. This allows the image sensor to have a larger pixel area within the same chip area, which, for example, makes it possible to increase the aperture ratio so as to improve the light sensitivity.

In one preferable mode of the solid-state image sensor according to the present invention, each of the pixel output lines is shared by two or more of the pixels and two or more of the memory sections corresponding to the aforementioned two or more of the pixels.

Providing one separate pixel output line for every pixel is also possible. However, this design requires as many pixel output lines as the number of pixels to be extended between the pixel area and the memory area. If the number of pixels is increased to improve image resolution, the number of pixel output lines increases accordingly, requiring a larger wiring space. This problem can be avoided by sharing one pixel output line among a plurality of pixels so as to decrease the number of lines and thereby reduce the space occupied by the wiring area. For example, if one pixel output line is shared by two pixels, the total number of pixel output lines will be approximately halved. This makes it possible to adopt various favorable designs, such as decreasing the pitch of the pixels in the memory area to improve image resolution, increasing the aperture ratio to improve light sensitivity, or reducing the entire chip area to increase the yield ratio of the production process.

When the pixel output line is shared by a plurality of pixels, it is impossible to simultaneously read signals from these pixels and write them to the memory sections. In that case, the timing of writing signals to the memory sections needs to be shifted for each pixel. The shift in the timing of sampling becomes relatively noticeable if the rate of the burst imaging is increased. Even in that case, the shift will not cause any substantial problem if the number of pixels sharing one pixel output line is rather small, such as two, three or four.

In the solid-state image sensor according to the present invention, the pixels may each include a reset element for resetting the photoelectric conversion element and the detection node. The reset element may be a single transistor.

In the normal drive mode, the photoelectric conversion element and the detection node are reset by the reset element every time a voltage signal stored in the detection node is outputted via the buffer element.

The signal obtained from each pixel in the previously described manner contains a noise component that remains after the photoelectric conversion element and the detection node are reset. To improve the S/N ratio of this signal, it is preferable to configure the image sensor so that each of the plurality of memory sections corresponding to one pixel has a plurality of capacitors each being capable of independently holding an output signal from one pixel, and control signals are supplied to the pixels and the memory sections so that, during one cycle of photocharge storage operation, a noise component that remains in each pixel after the photoelectric conversion element and the detection node are reset, and a signal that corresponds to an electric charge obtained in the photocharge storage operation, are respectively held in different capacitors of the same memory section.

In this mode of the image sensor, a computing means may be provided inside or outside the sensor to subtract the noise component from the signal, whereby the influence of the noise will be alleviated and an image signal with a high S/N ratio will be obtained. However, this configuration requires as many capacitors for memorizing noise components as the capacitors for memorizing signals. To reduce the number of capacitors for memorizing noise components, the procedure of storing signals in each pixel can be modified as follows.

In CMOS devices, the signal-reading process is a non-destructive process. Therefore, even after a signal is read from the detection node, the voltage signal remains unchanged until the device is reset. This characteristic is utilized in one preferable mode of the solid-state image sensor according to the present invention, wherein, after a voltage signal stored in the detection node is outputted via the buffer element, a voltage signal due to a photocharge generated by the photoelectric conversion element is stored in the detection node without resetting the photoelectric conversion element and the detection node, and the voltage signal is integrated during a series of exposure cycles and sequentially outputted for each cycle.

In this configuration, the voltage signal due to the photocharge is added and accumulated in the detection node until this node is reset via the reset element. The signal read via the buffer element continuously increases due to the addition and accumulation. After this signal is read, a signal corresponding to each exposure cycle can be obtained by calculating the difference of the read signals corresponding to consecutive exposure cycles for each pixel.

In this configuration, after a noise component is sampled immediately after the resetting of the photoelectric conversion element and the detection node, it is unnecessary to sample the noise component until the resetting is performed next time. During this period of time, only the sampling of normal signals needs to be repeated. Therefore, it is possible to reduce the number of capacitors used for memorizing the noise component. Accordingly, it is possible to reduce the space of the memory area required for the burst imaging to be performed over the same number of frames. This allows a reduction in the chip area or an enlargement of the pixel area to increase the number of pixels. Alternatively, it is possible to maintain the number of capacitors provided within the memory area and utilize those capacitors to increase the number of frames for the burst imaging.

Effect of the Invention

The solid-state image sensors according to the present invention can achieve high-speed operations while suppressing power consumption; for example, it is possible to ensure an adequately large number of continuously recordable frames for a high-speed operation that equals or exceeds one million frames per second. Thus, the imaging operation can be performed at higher speeds than in the case of the conventional solid-state image sensors, and useful information for the analysis of high-speed phenomena can be obtained. Since the deterioration of signals due to an intrusion of dark charges or excessive photocharges is alleviated, the S/N ratio is improved, so that the images obtained by the high-speed imaging operation will have better qualities.

Furthermore, the solid-state image sensor according to the present invention can be created with the smallest number of elements, lines and other components, except for the elements indispensible for high-speed imaging, such as the photoelectric conversion element and the memory element. This allows a reduction in the entire chip area, an increase in the aperture ratio, or a reduction in the pixel pitch to increase in the number of pixels. Decreasing the chip area improves the yield ratio in the production process and thereby contributes to the cost reduction of the individual solid-state image sensor. The reduction in the pixel pitch, accompanied by an increase in the number of pixels, leads to an improved image resolution. Increasing the aperture ratio improves the sensitivity, thereby enabling the sensor to have a larger dynamic range and higher S/N ratio.

BEST MODE FOR CARRYING OUT THE INVENTION

A solid-state image sensor according to one embodiment (the first embodiment) of the present invention is hereinafter described with reference to the attached drawings.

Figure 1:
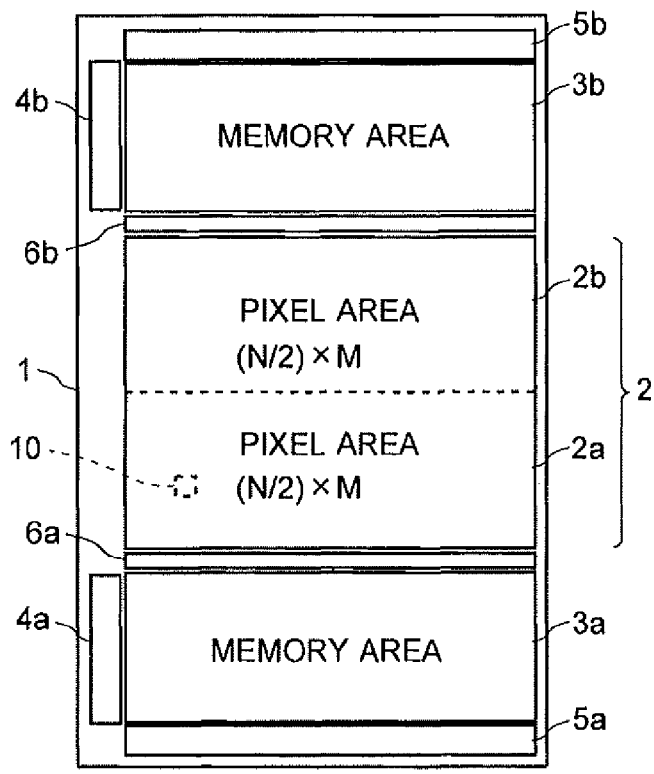
FIG. 1 is a plan view showing the schematic layout on a semiconductor chip of a solid-state image sensor which is an embodiment of the present invention.
Figure 2:
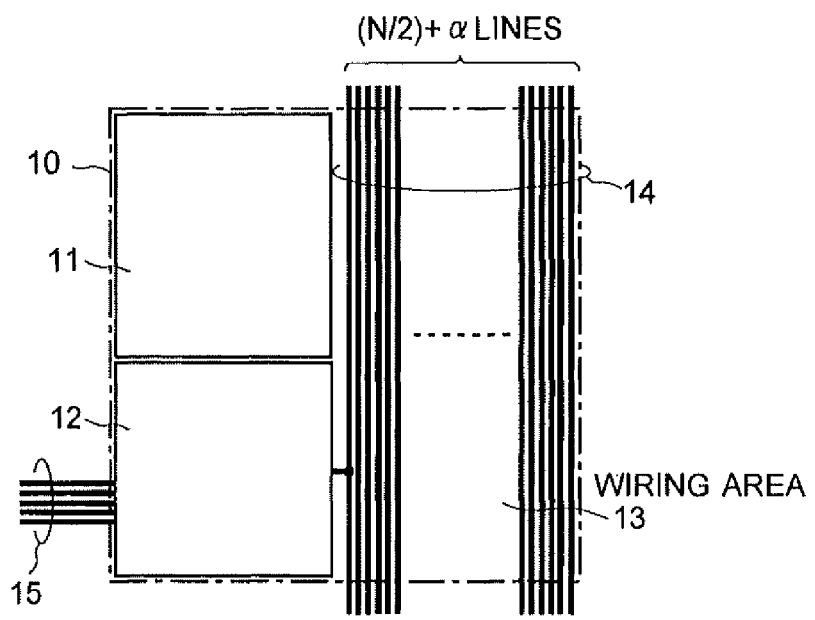
FIG. 2 is a plan view showing the schematic layout of one pixel within a pixel area in the solid-state image sensor of the present embodiment.
Figure 3:
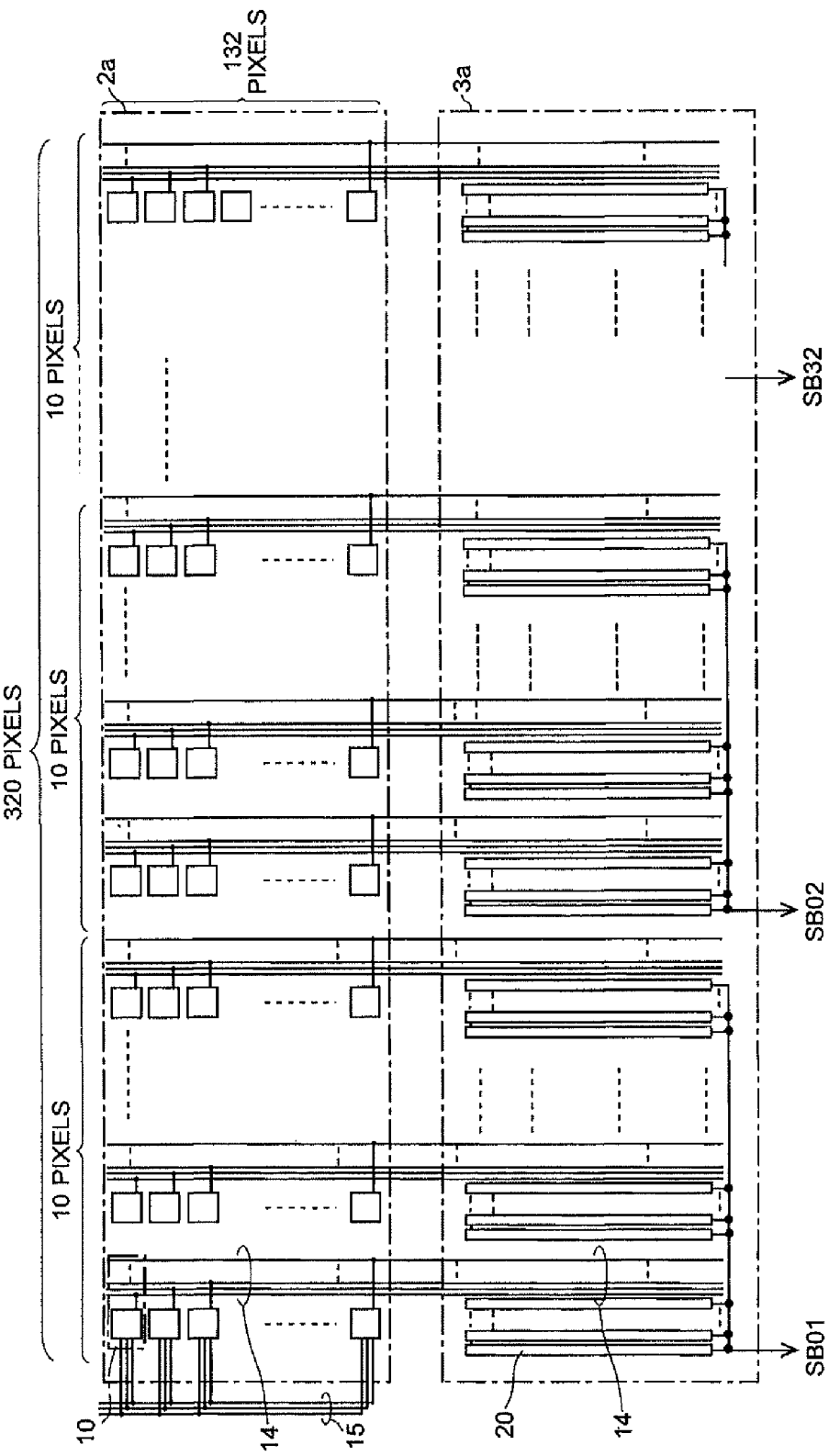
FIG. 3 is a block configuration diagram of the main portion in the solid-state image sensor of the present embodiment.
Figure 4:
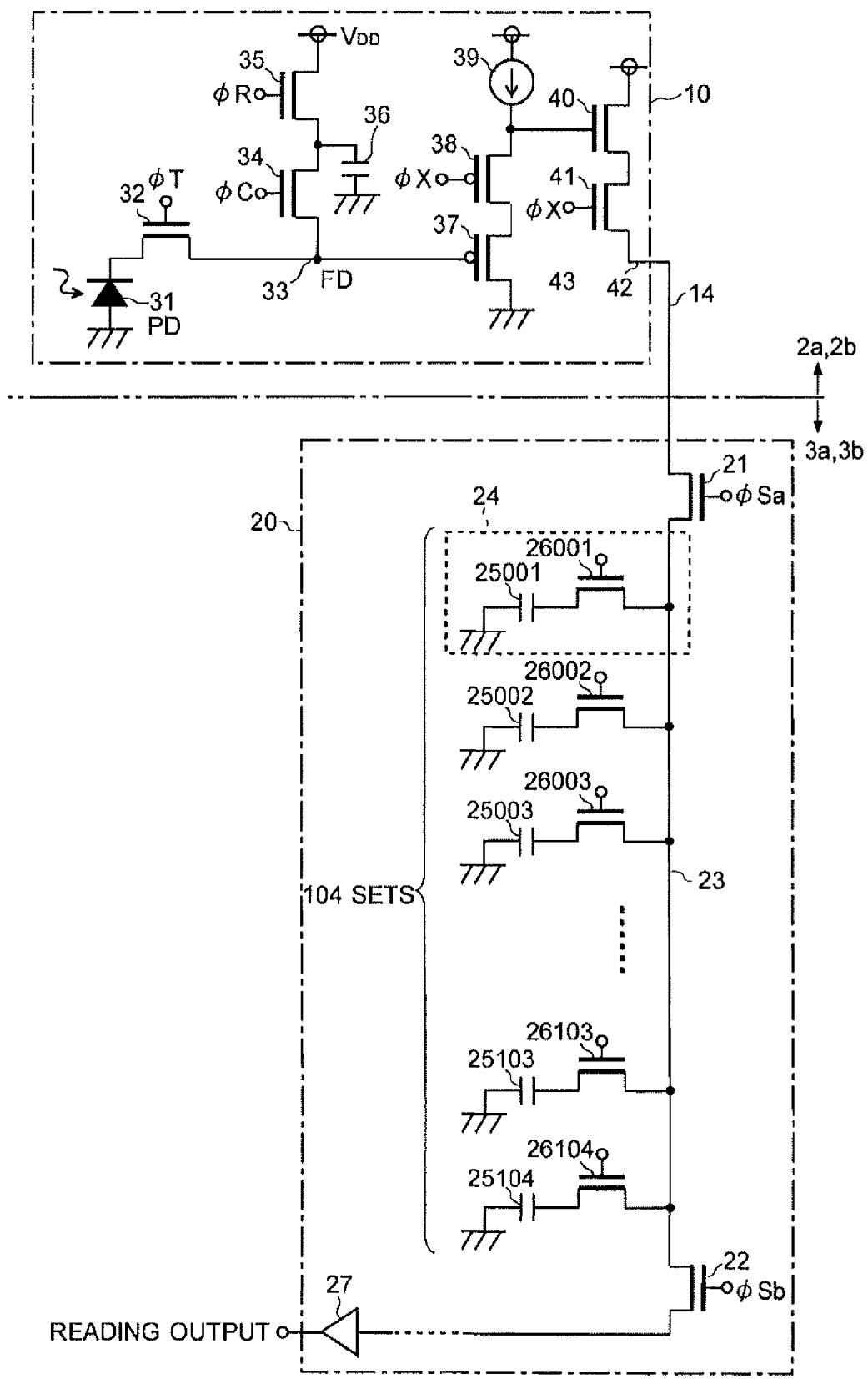
FIG. 4 is a circuit configuration diagram of one pixel shown in FIG. 2 and a memory unit corresponding to this pixel.

The overall configuration and structure of the solid-state image sensor according to the present embodiment is initially described. FIG. 1 is a plan view showing the schematic layout on a semiconductor chip of the solid-state image sensor of the present embodiment. FIG. 2 is a plan view showing the schematic layout of one pixel 10 within a pixel area 2 (2a and 2b). FIG. 3 is a block configuration diagram of the main portion in the solid-state image sensor of the present embodiment. FIG. 4 is a circuit configuration diagram of one pixel 10 shown in FIG. 2 and a memory unit 20 corresponding to this pixel.

As shown in FIG. 1, in the present solid-state image sensor, the pixel area 2 (2a and 2b) for receiving light and producing signals for each pixel and the memory areas 3a and 3b for holding the signals for a predetermined number of frames are not intermixed but completely separated from each other on the semiconductor substrate 1 so that each area forms a definite block. Within the rectangular pixel area 2, a total of N×M pixels 10 consisting of N rows and M columns are arranged in a two-dimensional array. This pixel area 2 is divided into the first pixel area 2a and second pixel area 2b, each of which has (N/2)×M pixels arranged inside.

Below the first pixel area 2a, a first memory area 3a is provided across a first current source area 6a having a small area, while a second memory area 3b is provided above the second pixel area 2b across a second current source area 6b, which also has a small area. The first and second memory areas 3a and 3b each include a first or second vertical scan circuit area 4a or 4b and a first or second horizontal scan circuit area 5a or 5b, each circuit area being provided with resisters, decoders and other circuits for controlling the reading of signals from the memory area 3a or 3b. Thus, this structure is nearly symmetrical with respect to a horizontal border line extending approximately through the center of the pixel area 2 to divide this area into upper and lower sections. The structure and operation of the upper and lower sections are basically identical. Therefore, the following description is mainly concerned with the structure and operation of the lower section, i.e. the first pixel area 2a, first memory area 3a, first vertical scan circuit area 4a and first horizontal scan circuit area 5a.

The number of pixels, i.e. the values of N and M, can be arbitrarily determined. Increasing these values improves the image resolution but also unfavorably results in either an increase in the entire chip area or a decrease in the chip area per one pixel. In the present example, N=264 and M=320; these are reasonable values for the solid-state image sensor to be used for high-speed imaging. Accordingly, the number of pixels arranged in each of the first and second pixel areas 2a and 2b is 132×320 pixels, as shown in FIG. 3.

As shown in FIG. 2, one pixel 10 occupies roughly one square area, which is further divided into three areas, i.e. the photoelectric conversion area 11, pixel circuit area 12 and wiring area 13. In the wiring area 13, a bundle of vertically extending (N/2)+α pixel output lines 14 are provided. The value of α may be zero, in which case the number of pixel output lines passing through one wiring area 13 in the present example is 132. However, when a large number of wirings (e.g. aluminum wirings or other kinds of metal wirings) parallel to each other are created, the width of the wires at both ends as well as their parasitic capacitances normally tend to be different. To address these problems, a dummy wire is additionally provided at each end. In this case, α=2, so that the total number of wires passing through one wiring area 13 is 134.

As shown in FIG. 4, the pixel 10 includes the following elements: a photodiode 31 for receiving light and generating photocharges (this element corresponds to the photoelectric conversion element in the present invention); a transfer transistor 32, which is located near the photodiode 31, for transferring the photocharges (this element corresponds to the transfer element in the present invention); a floating diffusion (FD) 33, which is connected to the photodiode 31 via the transfer transistor 32, for temporarily storing the photocharges (this element corresponds to the detection node in the present invention); a storage transistor 34 and storage capacitor 36 for storing charges overflowing from the photodiode 31 through the transfer transistor 32 in the process of storing photocharges (these elements correspond to the charge storage element in the present invention); a reset transistor 35 for discharging the charges stored in the floating diffusion 33 and the storage capacitor 36 (this element corresponds to the reset element in the present invention); and a source follower amplifier 43 with a two-stage configuration including a pair of cascade-connected PMOS transistors 37 and 38 and another pair of cascade-connected NMOS transistors 40 and 41, for extracting charges stored in the floating diffusion 33 or in both the floating diffusion 33 and the storage capacitor 36 to the outside as voltage signals (this amplifier corresponds to the buffer element in the present invention).

Drive lines 15 for supplying control signals φT, φC, φR and φX are respectively connected to the gate terminals of the transfer transistor 32, storage transistor 34, reset transistor 35, and selection transistors 38 and 41 of the source follower amplifier 43. As shown in FIG. 3, these drive lines are common to all the pixels (including the pixels within the second pixel area 2b).

The output 42 of the transistor 41 in the second stage of the source follower amplifier 43 is connected to one of the 132 pixel output lines 14 provided in the aforementioned wiring area 13. Since this pixel output line 14 is provided for each pixel 10, there is only one pixel 10 (and hence one source follower amplifier 43) connected to a given pixel output line 14.

The source follower amplifier 43 functions as a current buffer for driving the pixel output line 14 at high speeds. As shown in FIG. 3, each pixel output line 14 extends from the pixel area 2a to the memory area 3a and hence acts as a considerably large capacitive load. Driving such an element at high speeds requires a large-sized transistor through which high currents can be passed. However, in order to raise the gain of photoelectric conversion to enhance the detection sensitivity, the floating diffusion 33 for converting photocharges to voltage should preferably have the smallest possible capacitance. The parasitic capacitance of the gate terminal of the transistor connected to the floating diffusion 33 causes an effective increase in the capacitance of the floating diffusion 33. Therefore, for the aforementioned reason, this transistor 37 should preferably be a small-sized transistor with a small gate input capacitance. To fulfill both the supply of high current on the output side and the low capacitance on the input side, the source follower amplifier 43 has a two-stage configuration, where a small-sized transistor is used as the transistor 37 in the first stage to reduce the input gate capacitance while large-sized transistors are used as the second-stage transistors 40 and 41 to ensure a high output current.

The selection transistor 38 in the first stage of the source follower amplifier 43 is not essential for the basic operation. However, when the second-stage selection transistor 41 is off, this selection transistor 38 can be simultaneously turned off to block the flow of current from the current source 39 into the transistor 37 and thereby suppress the consumption of electric current.

If it is assumed that no electric charges will overflow during the process of storing photocharges via the transfer transistor 32 into the floating diffusion 33, or if such an overflow of electric charges is intentionally disregarded, it is unnecessary to provide the storage capacitor 36 and the storage transistor 34, and the floating diffusion 33 can be directly connected with the reset transistor 35.

Each memory unit 20 provided for one pixel 10 includes a writing-side transistor 21 connected to the pixel output line 14 (which corresponds to the writing-side gate element in the present invention), a reading-side transistor 22 (which corresponds to the reading-side gate element in the present invention), sampling transistors 26001-26104 and capacitors 25001-25104 connected to a common signal line 23 between the transistors 21 and 22, as well as a reading buffer 24 provided on the outside of the signal line 23 across the reading-side transistor 22. The number of sampling transistors and capacitors equals the number L of storage frames (L=104 in the present example). When a signal is being provided from the pixel 10 to the pixel output line 14, if the reading-side transistor 22 is turned off, the writing-side transistor 21 is turned on, and any one of the sampling transistors 26001-26104 is selectively turned on, then the signal transmitted from the pixel output line 14 to the common signal line 23 can be written to (held in) one capacitor 25001-25104 connected to the sampling transistor that has been turned on. In this signal-writing operation, a series of signals corresponding to up to 104 frames of burst images can be respectively held in the capacitors 25001-25104 by individually and sequentially turning on the sampling transistors 26001-26104 for each exposure cycle in the pixel 10.

On the other hand, while the writing-side transistor 21 is off, if the reading-side transistor 22 is turned on and then any one of the sampling transistors 26001-26104 is selectively turned on, the signal held in the capacitor connected to the selected sampling transistor will be read to the common signal line 23 and sent through the reading buffer 27 to the outside. In this reading process, a series of signals corresponding to up to 104 frames of burst images respectively held in the capacitors 25001-25104 can be sequentially, or serially, read by individually and sequentially turning on the sampling transistors 26001-26104.

The order of reading signals from the memory units 20 corresponding to the pixels 10 is controlled by the vertical shift registers included in the vertical scan circuit area 4a and 4b as well as the horizontal shift registers included in the horizontal scan circuit area 5a and 5b.

As shown in FIG. 3, the first memory area 3a has one memory unit 20 for each pixel 10. That is to say, there are 132 memory units 20 respectively provided for 132 pixels 10 arranged in the vertical direction. Every ten columns of memory units 20 arranged in the horizontal direction, each column corresponding to 132 pixels, form one group of memory units corresponding to 1320 pixels, and the output signal lines of the memory units 200 belonging to this group are merged into one line. Accordingly, there are 32 output signal lines extending from the first memory area 3a. In FIG. 3, these output signal lines are denoted by SB01-SB32.

Figure 5:
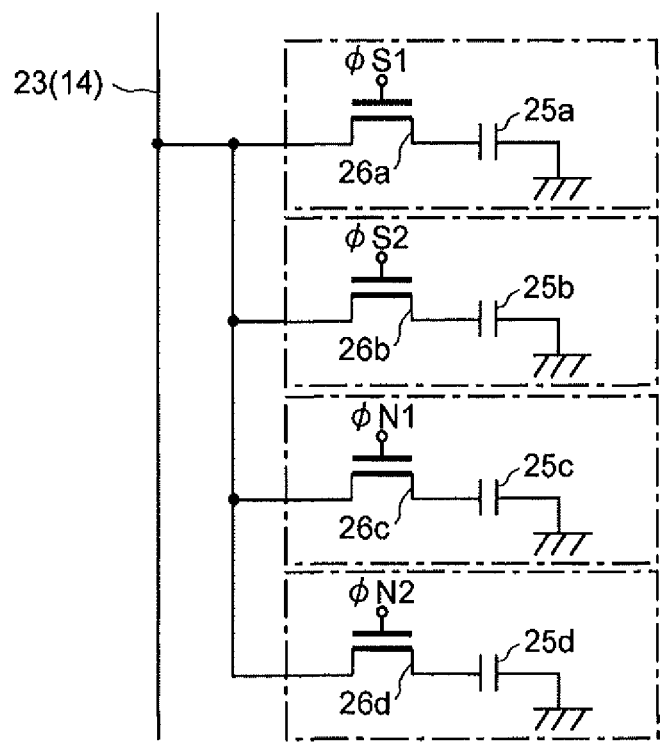
FIG. 5 is a configuration diagram of one memory section shown in FIG. 4.

In FIG. 4, one memory section 24 is represented by one sampling transistor and one capacitor for ease of explanation. However, as shown in FIG. 5, one memory section 24 actually consists of four memory sections 24a-24d, each of which is composed of one sampling transistor and one capacitor. Accordingly, one memory section 24 can hold four different analogue voltage signals transmitted from the same pixel 10 during one exposure cycle. The purpose of this configuration is to independently hold four analogue voltage signals, i.e. a signal corresponding to the charge before an overflow, a signal corresponding to the charge after an overflow, a noise signal contained in the signal corresponding to the charge before an overflow, and a noise signal contained in the signal corresponding to the charge after an overflow, in order to perform a dynamic range increasing process, which will be described later.

However, it is not always necessary to abide by this purpose; the four capacitors 25a-25d can also be used in other operational modes. For example, if the storage capacitor 36 of each pixel 10 is not used (or if the storage capacitor 36 is omitted from the configuration), there is no need to consider the signal after an overflow and the noise signal contained in the signal after an overflow, in which case the capacitors 25a and 25b can be used to increase the number of frames for burst imaging. As a result, the possible number of frames for burst imaging will be doubled to 208. If the noise removal is also unnecessary, all the capacitors 25a-25d can be used to hold signals, so that the possible number of frames for burst imaging will be further doubled to 416.

Similar to the storage capacitor 36 in the pixel 10, the capacitors 25a-25d can be created, for example, by a double polysilicon gate structure or stack structure. Using a CCD structure to hold electric charges would cause the problem that an aliasing due to dark charges caused by thermal excitation or other factors would be added to the photo signal. By contrast, a capacitor in the form of a double polysilicon gate structure or stack structure causes no such dark charges and hence no addition of aliasing, thus improving the S/N ratio of the signals to be read to the outside.

Figure 6:
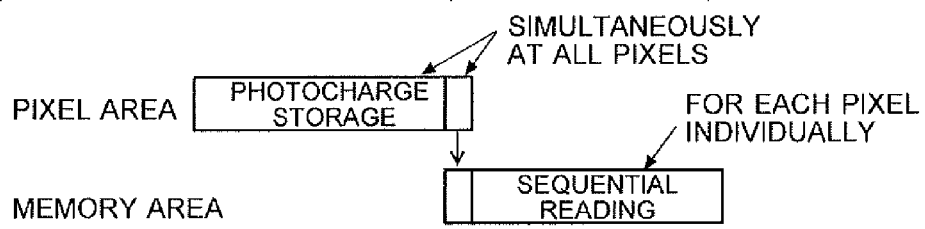
FIG. 6 is a schematic time chart of the continuous reading mode and burst reading mode in the solid-state image sensor of the present embodiment.
Figure 6:
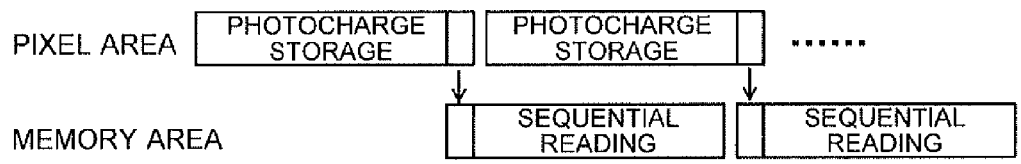
Figure 6:
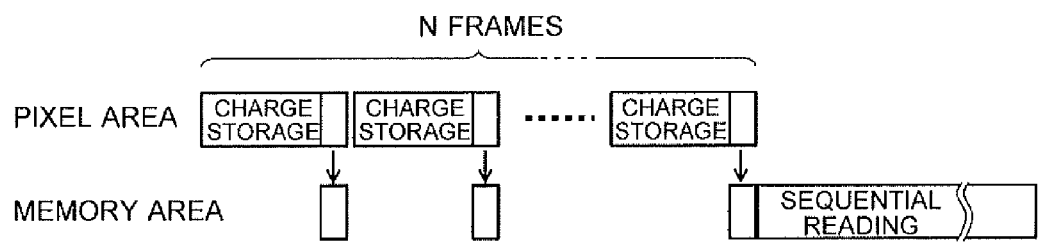

Drive methods and operations of the solid-state image sensor of the present embodiment are hereinafter described. The solid-state image sensor of the present embodiment has two major drive modes, i.e. a continuous reading mode and a burst reading mode. A schematic operation of the sensor in each of the two drive modes is hereinafter described by means of FIG. 6. FIG. 6 is a schematic time chart of the continuous reading mode and the burst reading mode.

(A) Continuous Reading Mode

The basic operation of the continuous reading mode is as shown in FIG. 6(a): After photocharges for one frame are stored in the pixels 10 of the pixel areas 2 (2a and 2b), the signals are collectively extracted to the corresponding pixel output lines 14 at all the pixels, and then these signals are held by the capacitors of the memory units 20. Thus, each of the pixel signals forming one frame is arranged in one of the capacitors of each memory unit 20, e.g. in the topmost capacitor 25001 in FIG. 4. Subsequently, horizontal shift registers and vertical shift registers are driven so as to sequentially read one frame of pixel signals in a predetermined order and send them to the outside.

The chart in FIG. 6(a) shows the timing for only one frame. The pixel areas 2a and 2b and the memory areas 3a and 3b can independently operate any time except during the period for transmitting signals through the pixel output lines 14. Accordingly, it is possible to store photocharges at the pixel areas 2a and 2b while sequentially reading signals from the memory areas 3a and 3b. Therefore, as shown in the timing chart of FIG. 6(b), the period for storing photocharges and the period for the sequential reading can overlap each other so that the imaging operation will be almost continuously repeated. In the ease of a normal imaging operation that is not performed at high speeds, the imaging can be continued at low frame rates for a long time with the timing as shown in FIG. 6(b). In this case, the maximum frame rate is determined by the time required to sequentially read all pixel signals. That is to say, the upper limit of the frame rate is determined by the upper limit of the clock frequency of a reading amplifier.

(B) Burst Reading Mode

In the burst reading mode, as shown in FIG. 6(c), the following process is repeated: After the photocharges for one frame are stored in each pixel without performing sequential reading of the pixel signals, the signals are collectively extracted through the corresponding pixel output lines 14 at all the pixels, and then the signal charges are held by one of the capacitors 25001-25104 of the memory unit 20. In this step, the signals are sequentially stored, one frame after another, into the capacitors 25001-25104 prepared for 104 frames. Subsequently, for example, after image signals of 104 frames (or any number of frames less than 104) have been held in the capacitors 25001-25104, these pixel signals corresponding to 104 frames are sequentially read and sent to the outside.

The burst reading mode does not include the step of extracting signals to the outside during the imaging operation and hence is free from the limitation on the frame rate due to the upper limit of the clock frequency for the reading amplifier. The practically achievable maximum frame rate is mainly limited by the time required for the photocharges generated in the photodiode 31 to be collected and transferred to the floating diffusion 33, and this process requires only an extremely short period of time. Therefore, for example, it is possible to continuously perform the imaging operation at such a high frame rate that equals or even exceeds one million frames per second.

The operations of producing signals by photoelectric conversion and storing those signals into the memory section 24 in each pixel 10 during the high-speed burst imaging is hereinafter detailed with reference to FIGS. 7-10.

The solid-state image sensor of the present invention offers two different options for the drive mode: one drive mode is for a short photocharge storage time and the other for a relatively long photocharge storage time. As a rough guide, the former mode is suitable for a photocharge storage time shorter than approximately 10 μsec, i.e. when the amount of dark charges produced by the floating diffusion can be regarded as negligible. This drive mode can be preferably used when the imaging is performed at a high rate of one million frames per second or higher.

(A) Drive Mode for Short Photocharge Storage Time

Figure 7:
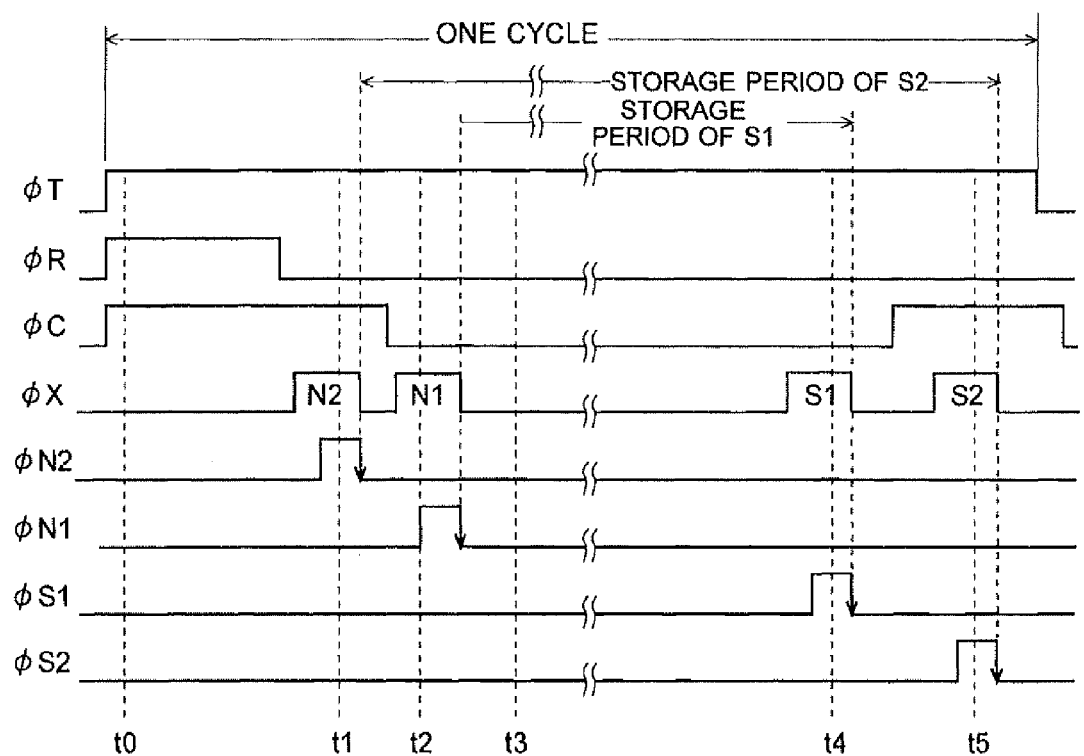
FIG. 7 is a timing chart of an operation mode of the solid-state image sensor of the present embodiment in the case where the photocharge storage time is short.
Figure 8:
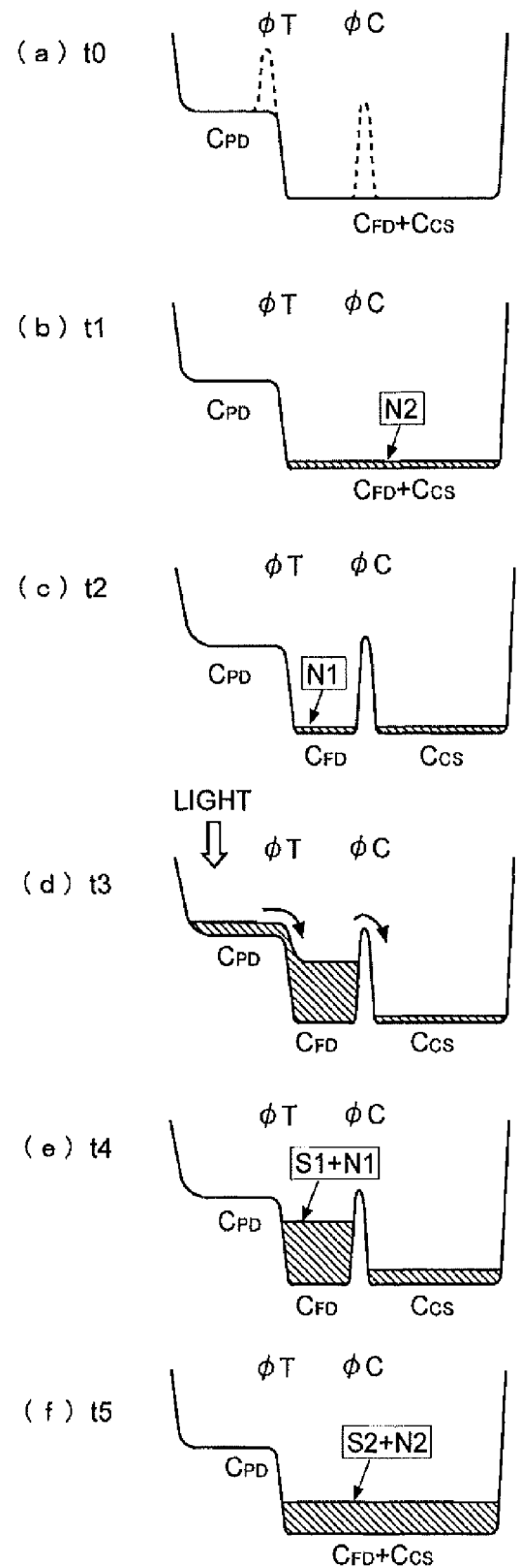
FIG. 8 is a schematic potential diagram inside each pixel during the operation shown in FIG. 7.

FIG. 7 is a drive timing chart of the operation mode for a short photocharge storage time, and FIG. 8 is a schematic potential diagram inside the pixel 10 during this drive mode. In FIG. 8 (and in FIG. 10 to be mentioned), $C_{PD}$, $C_{FD}$ and $C_{CS}$ denote the capacitances of the photodiode 31, floating diffusion 33 and storage capacitor 36, respectively, and $C_{FD}+C_{CS}$ denotes the combined capacitance of the floating diffusion 33 and storage capacitor 36.

Before the photocharge storage is performed, the signals φT, φC and φR, which are common control signals, are set to a high level to turn on the transfer transistor 32, storage transistor 34 and reset transistor 35 (time t0), whereby the floating diffusion 33 and storage capacitor 36 are reset (or initialized). At this point in time, the photodiode 31 is completely depleted. The potential at this point in time is shown in FIG. 8(a).

Next, φR is set to a low level to turn off the reset transistor 35, whereupon a noise signal N2, which equivalently contains a random noise generating in the floating diffusion 33 and storage capacitor 36 and a fixed pattern noise resulting from a variation in the threshold voltage of the transistor 37 in the source follower amplifier 43, is generated in the floating diffusion 33 (refer to FIG. 8(b)). At this point, φX is set to a high level to turn on the transistors 38 and 41, whereupon an output current corresponding to the noise signal N2 flows through the pixel output line 14. At this timing (time t1), a sampling pulse φN2 is given to one memory section 24 to turn on the sampling transistor 26d so that the noise signal N2 outputted through the pixel output line 14 is written to the capacitor 25d.

Subsequently, φC is set to the low level to turn off the storage transistor 34, whereupon the signal charges stored in the floating diffusion 33 and storage capacitor 36 at this point in time are distributed to the floating diffusion 33 and the storage capacitor 36 according to the ratio of their capacitances $C_{FD}$ and $C_{CS}$ (refer to FIG. 8(c)). In this state, a noise signal N1, which contains a random noise generated when φC was turned off and a fixed pattern noise resulting from a variation in the threshold voltage of the transistor 37 in the source follower amplifier 43, is generated in the floating diffusion 33. At this point, φX is set to the high level to turn on the transistors 38 and 41, whereupon an output current corresponding to this noise signal N1 flows through the pixel output line 14. At this timing (time t2), a sampling pulse φN1 is given to one memory section 24 to turn on the sampling transistor 26c so that the noise signal N1 outputted through the pixel output line 14 is written to the capacitor 25c.

Since the transfer transistor 32 is maintained in the ON state, the photocharges generated by light falling onto the photodiode 31 flow through the transfer transistor 32 into the floating diffusion 33, and are stored in the floating diffusion 33, being superimposed on the noise signal N1 (time t3). If the floating diffusion 33 is saturated due to a large amount of photocharges generated in the photodiode 31 by an incidence of strong light, the overflowing charges are stored through the storage transistor 34 into the storage capacitor 36 (refer to FIG. 8(d)). Setting the threshold voltage of the storage transistor 34 at an appropriately low level enables those charges to be efficiently transferred from the floating diffusion 33 to the storage capacitor 36. By this method, it is possible to effectively utilize the saturated charges without discarding them even if the floating diffusion 33 has a small capacitance $C_{FD}$ and can store only a small amount of charges in the maximally saturated state. In this manner, both the charges produced before charge saturation (overflow) at the floating diffusion 33 and those produced after charge saturation (overflow) can be utilized as output signals.

After a predetermined photocharge storage time has elapsed, φX is set to the high level to turn on the transistors 38 and 41, with the storage transistor 34 in the OFF state. Then, a sampling pulse φS1 is given to the memory section 24 to turn on the sampling transistor 26a, whereby a signal corresponding to the charge stored in the floating diffusion 33 at that point in time (time t4) is extracted through the pixel output line 141 and written to the capacitor 25a (refer to FIG. 8(e)). The signal stored in the floating diffusion 33 at this point in time results from the superposition of a noise signal N1 and a signal S1 corresponding to the charge before an overflow. Accordingly, the signal held in the capacitor 25a equals S1+N1, which does not reflect the amount of charge stored in the storage capacitor 36.

Immediately after that, φC is set to the high level to turn on the storage transistor 34, whereupon the charge held in the floating diffusion 33 at that point in time is mixed with the charge held in the storage capacitor 36 (refer to FIG. 8(f)). In this state, φX is set to the high level to turn on the transistors 38 and 41, and a sampling pulse φS2 is given to the memory section 24 to turn on the sampling transistor 26b (time t5). As a result, a signal corresponding to the charges held in the floating diffusion 33 and the storage capacitor 36, i.e. a signal resulting from the superposition of the noise signal N2 and the signal S2 corresponding to the charge after the overflow, is extracted through the pixel output line 14 and written to the capacitor 25b. Accordingly, the signal to be held in the capacitor 25b is S2+N2, which reflects the amount of charge stored in the storage capacitor 36.

By the process described thus far, the signals S1+N1, S2+N2, N1 and N2 are respectively held in the four capacitors 25a, 25b, 25c and 25d included in one memory section 24. Thus, one cycle of the image signal acquisition operation is completed. As already explained, the noise signals N1 and N2 containing the random noise and fixed pattern noise are obtained separately from the other signals containing these noise signals. Therefore, it is possible to obtain high S/N image signals free from the influence of the noise signals N1 and N2 by reading each of these signals from the capacitors 25a, 25b, 25c and 25d and then subjecting the read signals to a subtracting operation. Since the charges overflowing from the floating diffusion 33 are utilized without being discarded, even a strong incident light barely causes saturation, so that the resultant signal can reflect the light. Thus, a wide dynamic range is ensured. The possibilities of widening the dynamic range in this manner are described in detail in the Japanese Unexamined Patent Application Publication No. 2006-245522 and other documents. Therefore, no detailed explanation will be made in this specification.

(B) Operation Mode for Relatively Long Photocharge Storage Time

Figure 9:
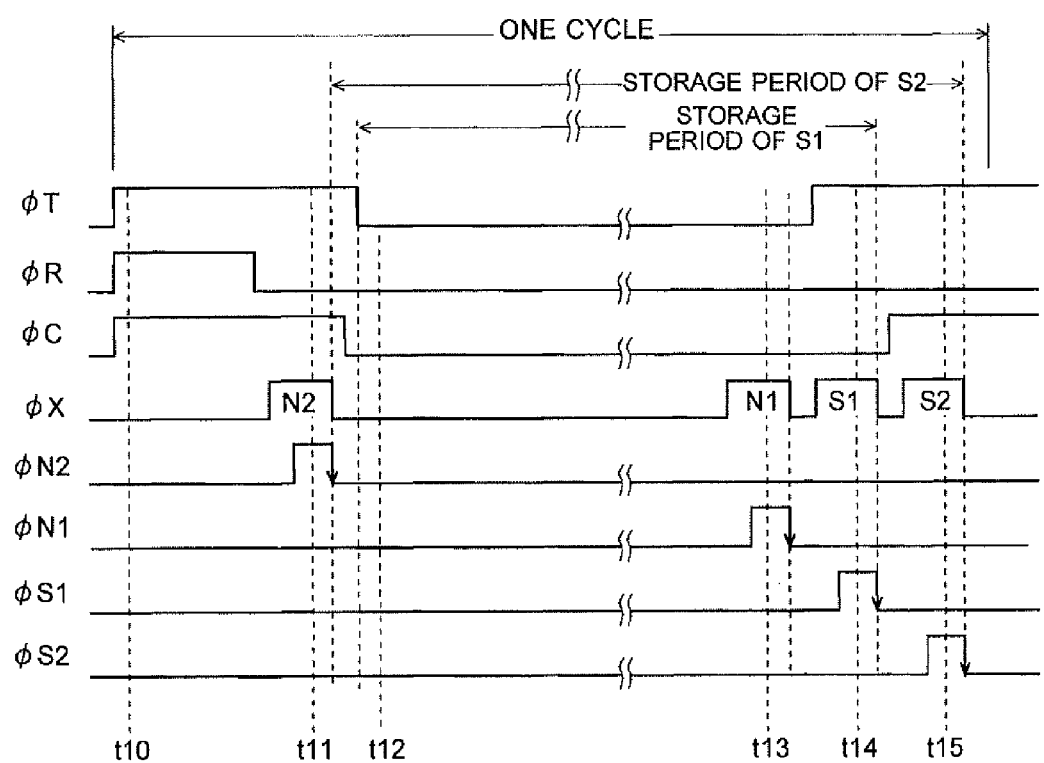
FIG. 9 is a timing chart of an operation mode of the solid-state image sensor of the present embodiment in the case where the photocharge storage time is relatively long.
Figure 10:
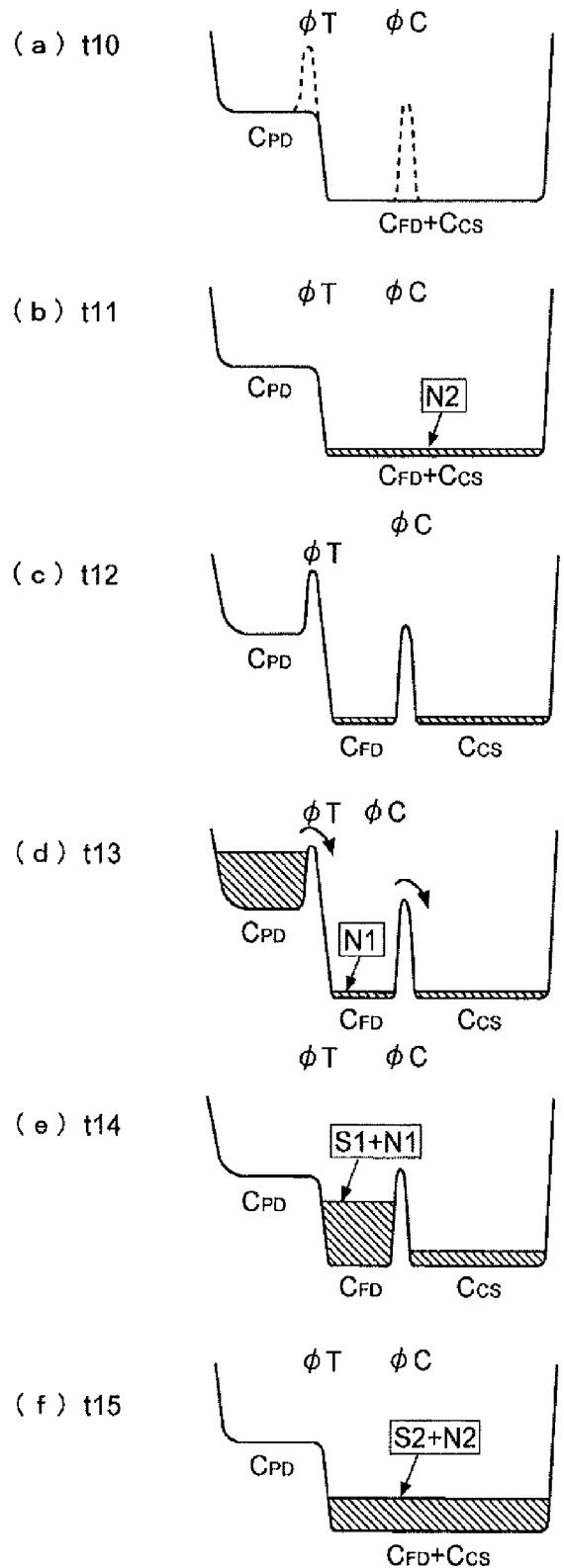
FIG. 10 is a schematic potential diagram inside each pixel during the operation shown in FIG. 9.

An operation for a relatively long photocharge storage time is hereinafter described. FIG. 9 is a drive timing chart in the case where the photocharge storage time is relatively long, and FIG. 10 is a schematic potential diagram inside the pixel 10 in this operation.

The most significant difference from the case of the short photocharge storage time exists in many points. For example, the transfer transistor 32 is turned off during the photocharge storage period; and the sampling of the noise signal N1 is performed at the end of the photocharge storage period so that the dark charges (and photocharges) that generate in the floating diffusion 33 will not be included in the signal S1. The purpose of turning off the transfer transistor 32 is to create an accumulation state at the interface between the silicon and insulating film immediately below its gate, thus filling the silicon surface with holes to prevent intrusion of dark charges through the interface between the silicon and insulating film.

Before the photocharge storage is performed, φT, φC and φR are set to high levels to turn on the transfer transistor 32, storage transistor 34 and reset transistor 35 (time t10), whereby the floating diffusion 33 and storage capacitor 36 are reset (or initialized). At this point in time, the photodiode 31 is completely depleted. The state of potential at this point in time is shown in FIG. 10(a).

Next, φR is set to the low level to turn off the reset transistor 35, whereupon a noise signal N2, which equivalently contains a random noise generating in the floating diffusion 33 and the storage capacitor 36 and a fixed pattern noise resulting from a variation in the threshold voltage of the transistor 37 in the source follower amplifier 43, is generated in the floating diffusion 33 (refer to FIG. 10(b)). In this state, φX is set to the high level to turn on the transistors 38 and 41, whereupon an output current corresponding to this noise signal N2 flows through the pixel output line 14. At this timing (time t11), a sampling pulse φN2 is given to the memory section 24 to turn on the sampling transistor 26d, whereby the noise signal N2 is extracted through the pixel output line 141 and written to the capacitor 25d. The operations to this point are identical to those of the previously described operation mode for a short photocharge storage time.

Next, φC is set to the low level to turn off the storage transistor 34, whereupon the signal charges stored in the floating diffusion 33 and storage capacitor 36 at this point in time are distributed to the floating diffusion 33 and storage capacitor 36 according to the ratio of their capacitances $C_{FD}$ and $C_{CS}$. Furthermore, φT is set to the low level to turn off the transfer transistor 32, and φX is also set to the low level to turn off the two transistors 38 and 41 (time t12). As a result, a potential barrier is formed between the photodiode 31 and the floating diffusion 33, creating a condition where photocharges can be stored in the photodiode 31 (refer to FIG. 10(c)).

The photocharges generated by incident light falling onto the photodiode 31 are stored in the capacitance $C_{PD}$ of the photodiode 31. When saturation occurs in the photodiode 31, excessive charges flow through the transfer transistor 32, to be stored in the floating diffusion 33 and superimposed on the noise signal that has been distributed as described previously. If the floating diffusion 33 is saturated by stronger incident light, the charges will begin to be stored through the storage transistor 34 into the storage capacitor 36 (refer to FIG. 10(d)).

Setting the threshold voltage of the storage transistor 34 at a level appropriately lower than that of the transfer transistor 32 enables the charges saturated in the floating diffusion 33 to be efficiently transferred from the floating diffusion 33 to the storage capacitor 36 without being returned to the photodiode 31. By this method, it is possible to effectively use the saturated charges without discarding them even if the floating diffusion 33 has a small capacitance $C_{FD}$ and can store only a small amount of charges. In this manner, both the charges produced before the overflow at the floating diffusion 33 and those produced after the overflow can be utilized as output signals.

After a predetermined photocharge storage time has elapsed, φX is set to the high level to turn on the transistors 38 and 41, after which a sampling pulse φN1 is given to the memory section 24 to turn on the sampling transistor 26c, whereby a noise signal N1 corresponding to the signal charge stored in the floating diffusion 33 at this point in time (time t13) is extracted through the pixel output line 14 and held in the capacitor 25c. The noise signal N1 at this point in time contains a fixed pattern noise due to a variation in the threshold voltage of the transistor 37 in the source follower amplifier 43.

Next, φT is set to the high level to turn on the transfer transistor 32, whereupon the photocharges stored in the photodiode 31 are completely transferred to the floating diffusion 33 (refer to FIG. 10(e)). Immediately after that (time t14), with the transistors 38 and 41 in the ON state, a sampling pulse φS1 is given to the memory section 24 to turn on the sampling transistor 26a, whereby a signal corresponding to the charge stored in the floating diffusion 33 is extracted through the pixel output line 14 and written to the capacitor 25a. This signal results from the superposition of the aforementioned noise signal N1 and the signal corresponding to the charge stored in the photodiode 31, i.e. the signal S1 before the overflow, and hence equals S1+N1.

Subsequently, φC is set to the high level to turn on the storage transistor 34, whereupon the charge held in the floating diffusion 33 at that point in time is mixed with the charge held in the storage capacitor 36 (refer to FIG. 10(f)). In this state (time t15), a sampling pulse φS2 is given to the memory section 24 to turn on the sampling transistor 26b, whereby a signal corresponding to the charges held in the floating diffusion 33 and storage capacitor 36 are extracted through the pixel output line 14 and held in the capacitor 25b. This signal equals S2+N2.

As a result of the processes described thus far, the signals S1+N1, S2+N2, N1 and N2 are respectively held in the four capacitors 25a, 25b, 25c and 25d included in one memory section 24. Thus, one cycle of image signal acquisition is completed. Similar to the case of the operation mode for the short photocharge storage time, the noise signals N1 and N2 containing the random noise and fixed pattern noise are obtained separately from the other signals containing these noise signals. Therefore, it is possible to obtain high S/N image signals free from the influence of the noise signals N1 and N2 by reading each of these signals from the capacitors 25a, 25b, 25c and 25d and then subjecting the read signals to a subtracting operation. Since the charges that have overflowed from the floating diffusion 33 are not discarded but utilized, even a strong incident light barely causes saturation, so that the resultant signal can reflect the light. Thus, a wide dynamic range is ensured.

As described previously, the control signals φX, φT, φR and φC supplied to each pixel 10 are common to all the pixels. Therefore, the aforementioned operations of storing photocharges and transferring signals from each pixel 10 to the memory section 24 are simultaneously performed at all the pixels 10. That is, by one cycle of these operations, one frame of image signals are held in the memory sections 24 inside the 320 memory units 20 horizontally arranged in the memory area 3a shown in FIG. 3. The operations are repeated 104 cycles to hold image signals in the memory sections 24 inside all the memory units 20. In the $105^{th}$ and subsequent cycles, the operation of writing signals to the memory sections 24 is once more initiated from the topmost memory section 24. Thus, the signal-holding operation is cyclically carried out. This process is continued, for example, until a command signal for discontinuing the imaging is externally given. When the command signal for discontinuing the imaging is given and the imaging is discontinued, the latest 104 frames of image signals are held in the memory areas 3a and 3b.

When, as described previously, new signals are to be held in the capacitors 25a-25d of a memory section 24 in which some signals are already present, it is necessary to reset the capacitors in order to discard those older signals. For this purpose, though not shown in the figures, a resetting transistor is connected to each signal line 23. To reset the capacitor 25 of a given memory section 24, the sampling transistors 26a-26d of the memory section 24 are turned on and, simultaneously, the resetting transistor connected to the signal line 23 is turned on, whereby the signals stored in the capacitors 25a-25d are reset through the sampling transistors 26a-26d. After this resetting operation is performed, new signals are held in the capacitors 25a-25d.

The signals held in the capacitors 25a-25d of each memory section 24 are read by turning on the reading-side transistor 22 and sequentially turning on the sampling transistors 26a-26d. Using the signals sequentially read from each of the four capacitors 25a-25d in the same memory section 24, a subtraction circuit (now shown) performs the subtracting operations of (S1+N1)−N1 and (S2+N2)−N2 to extract each of the signals S1 and S2 free from the random noise and fixed pattern noise. Which of S1 and S2 should be used as the pixel signal is determined with reference to an appropriate signal level (threshold value) equal to or lower than the saturation level of the signal S1; S1 is selected when the signal is equal to or higher than the reference level, and S2 when the signal is lower than the reference level. By performing this selection below the signal saturation level, it is possible to avoid the influence of saturation variation of the signal S1.

As described thus far, the solid-state image sensor of the present embodiment is capable of performing burst imaging at high speeds and producing signals with a higher S/N ratio and wider dynamic range.

The configuration and operations of a solid-state image sensor according to another embodiment (the second embodiment) of the present invention are hereinafter described by means of FIGS. 11-13. The solid-state image sensor of the first embodiment has one separate pixel output line for each and every pixel. Therefore, signals or noises can be written from all the pixels 10 to the capacitors of the memory units 20 at completely the same timing. However, this configuration requires a large wiring area within the pixel areas 2a and 2b since there are the same number of pixel output lines 14 as the number of pixels so as to connect the pixel areas 2a and 2b and the memory areas 3a and 3b. This causes some disadvantages, such as an increase in the pixel pitch, a decrease in the aperture ratio or an increase in the total area of the pixel areas 2a and 2b.

The solid-state image sensor according to the second embodiment is aimed at solving the aforementioned problem by reducing the number of pixel output lines 14. FIG. 11 is a configuration diagram of pixels connected to one pixel output line 14 in the solid-state image sensor of the second embodiment. FIG. 12 is a drive timing chart of an operation mode of the solid-state image sensor of the second embodiment in the case where the photocharge storage time is short. FIG. 13 is a drive timing chart of an operation mode of the solid-state image sensor of the second embodiment in the case where the photocharge storage time is long.

Figure 11:
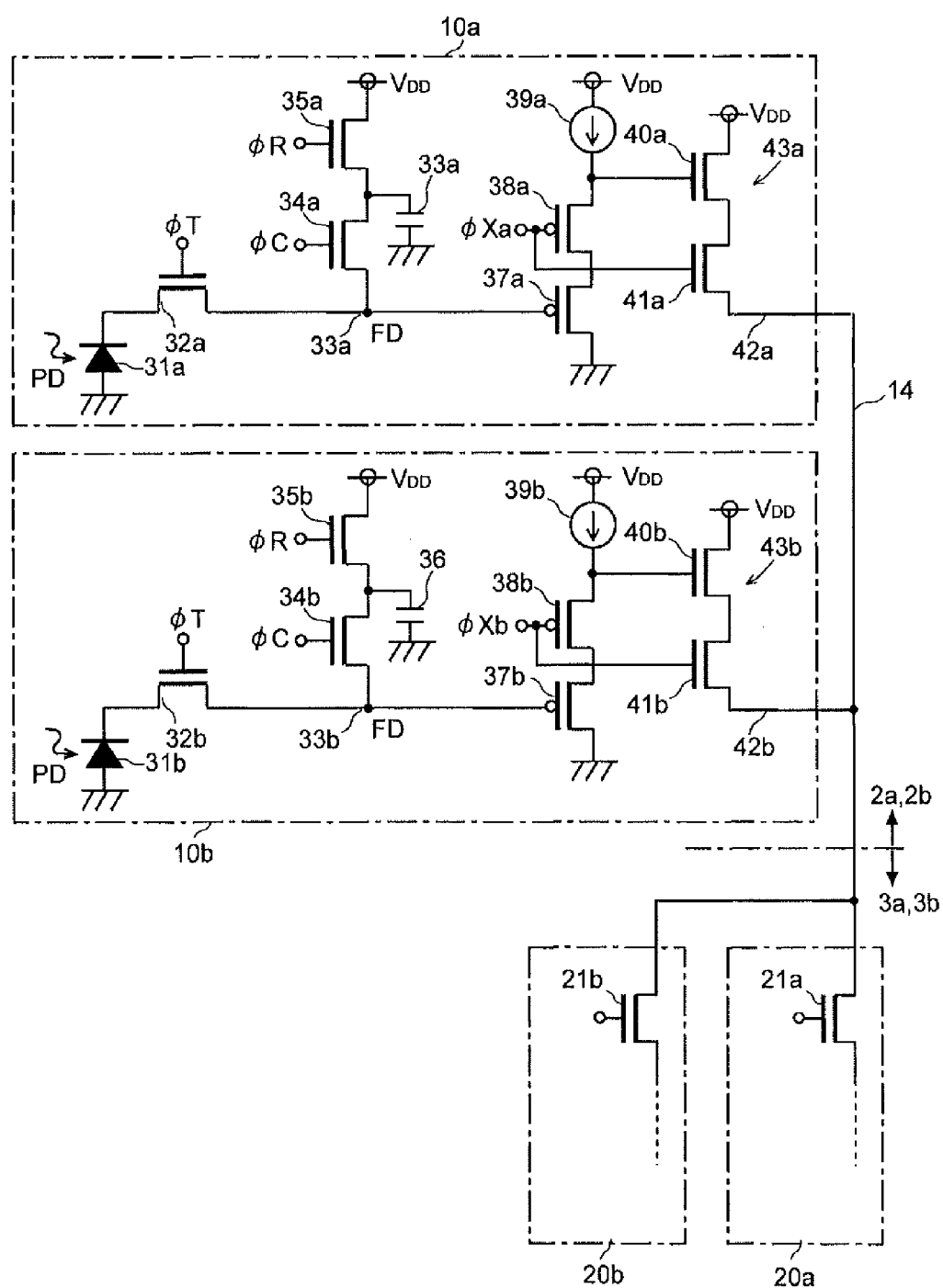
FIG. 11 is a configuration diagram of pixels connected to one pixel output line in the solid-state image sensor of another embodiment (the second embodiment) of the present invention.
Figure 12:
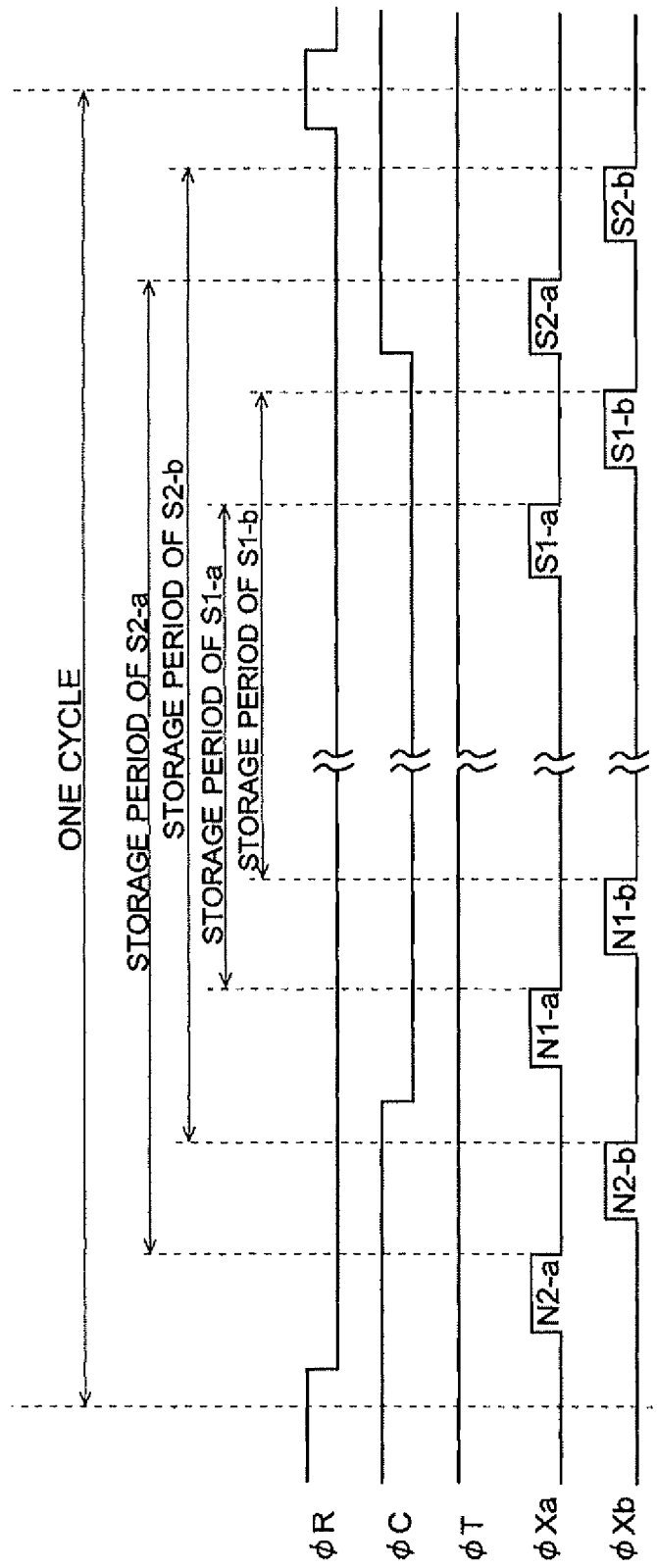
FIG. 12 is a drive timing chart of an operation mode of the solid-state image sensor of the second embodiment in the case where the photocharge storage time is short.

As shown in FIG. 11, in this solid-state image sensor, two pixels 10a and 10b as well as two memory units 20a and 20b are connected to one pixel output line 14. That is to say, as opposed to the configuration of the first embodiment in which each pixel output line 14 connects one pixel 10 and one memory unit 20, the pixel output line 14 in the second embodiment is shared by two pixels and two memory units. Therefore, the total number of pixel output lines 14 is reduced to one half of the total number of pixels, so that the space occupied by the pixel output lines 14 is significantly decreased as compared to the first embodiment. As a result, the pixel pitch can be further reduced, so that the number of pixels can be increased to improve image resolution when, for example, the space of the pixel area is the same. Alternatively, it is possible to increase the aperture ratio and enhance the light sensitivity.

However, sharing one pixel output line 14 by two pixels 10a and 10b means that the transfer of signals from the pixels 10a and 10b to the memory units 20a and 20b cannot be performed at completely the same timing, and it is necessary to shift the timing. Accordingly, the drive timing shown in FIG. 7 in the first embodiment is modified as shown in FIG. 12. Similarly, the drive timing shown in FIG. 9 in the first embodiment is modified as shown in FIG. 13.

The signals φR, φC and φT, which are associated with operations that are completed inside each of the pixels 10a and 10b, are common to both pixels 10a and 10b. The difference from the first embodiment solely exists in that the signals φXa and φXb used for extracting to the pixel output line 14 a normal signal (S1-a, S1-b, S2-a or S2-b) generated in each pixel 10a or 10b or a noise signal (N-1a, N1-b, N2-a or N2-b), and the signals for writing those signals to the capacitors of the memory units 20a and 20b, are separated between the pixels 10a and 10b as well as between the memory units 20a and 20b. Many operations, such as the storage of photocharges in each pixel 10a or 10b and the writing of signals to the capacitor in each memory unit 20a or 20b, follow basically the same procedures as already described in the first embodiment, except for the shift in the timing of writing signals from the pixels 10a and 10b to the capacitors in the memory units 20a and 20b. Accordingly, detailed descriptions of those operations will be omitted.

Figure 13:
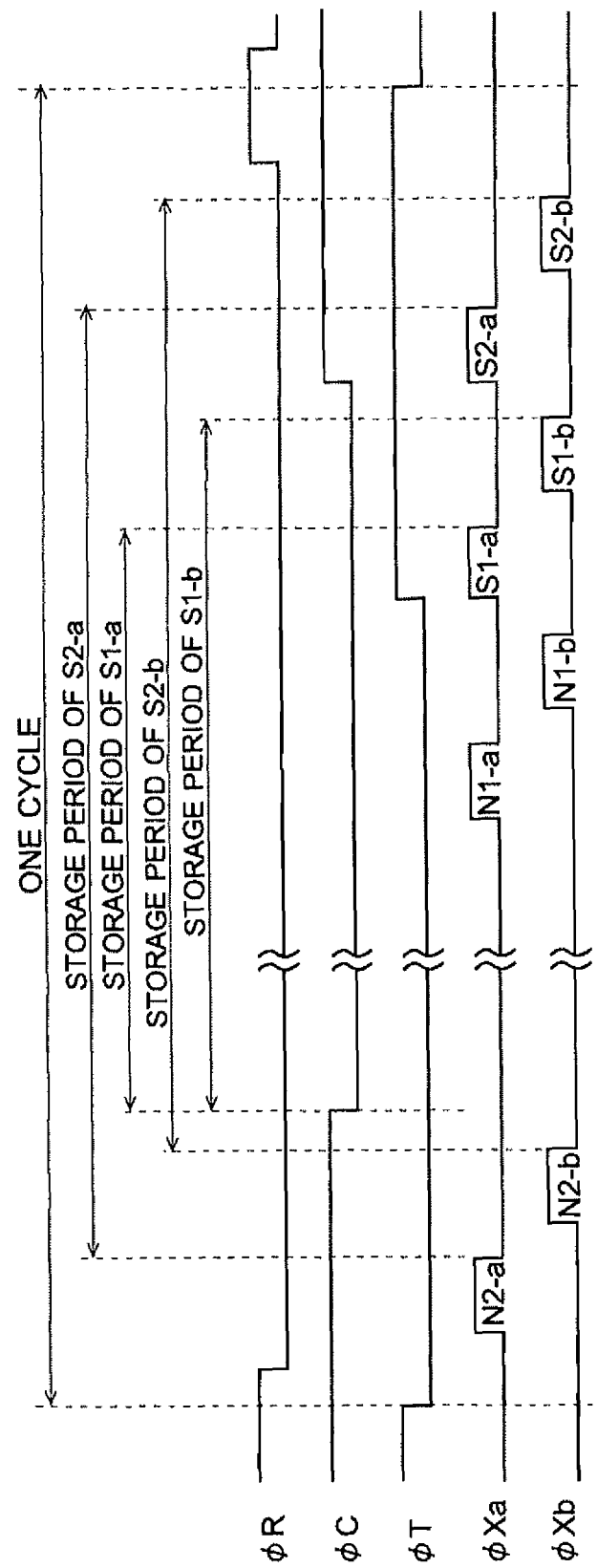
FIG. 13 is a drive timing chart of an operation mode of the solid-state image sensor of the second embodiment in the case where the photocharge storage time is long.

As one example, consider the case where, in FIG. 13, the period of time from a falling point of φT to a falling point of φC is set to 40 nsec and the period of time from the rising point of the pulse N1-a in φXa to the falling point of φT is set to 100 nsec. In this case, a time difference of approximately 15 nsec occurs between the timing of writing a signal produced by the pixel 10a and the timing of writing a signal produced by the pixel 10b. If the frame rate is 10 MHz (i.e. the exposure cycle is 100 nsec), this difference corresponds to 15% of the cycle, which may have non-negligible influences on certain kinds of images. If frame rate is 1 MHz (i.e. the exposure cycle is 1 μsec), the time difference is as small as 1.5% and barely influences the obtained images.

An operation of a solid-state image sensor according to another embodiment (the third embodiment) of the present invention is hereinafter described by means of FIGS. 14 and 15. In the solid-state image sensor of the first embodiment, the operation of resetting the photodiode 31 and the floating diffusion 33 by turning on the reset transistor 35 is carried out for every exposure cycle. In the solid-state image sensor of the third embodiment, the drive timing is modified so that the resetting of the photodiode 31 and the floating diffusion 33 is halted for a plurality of exposure cycles so as to add and accumulate, in the floating diffusion 33, a voltage signal due to the photocharges generated by photoelectric conversion.

For convenience, this reading method is hereinafter referred to as "integral reading." The feasibility of integral reading is supported by the fact that the signal stored in the floating diffusion 33 in each pixel 10 does not change even if the signal is read through the source follower amplifier 43, i.e. this reading process is a non-destructive process.

Figure 14:
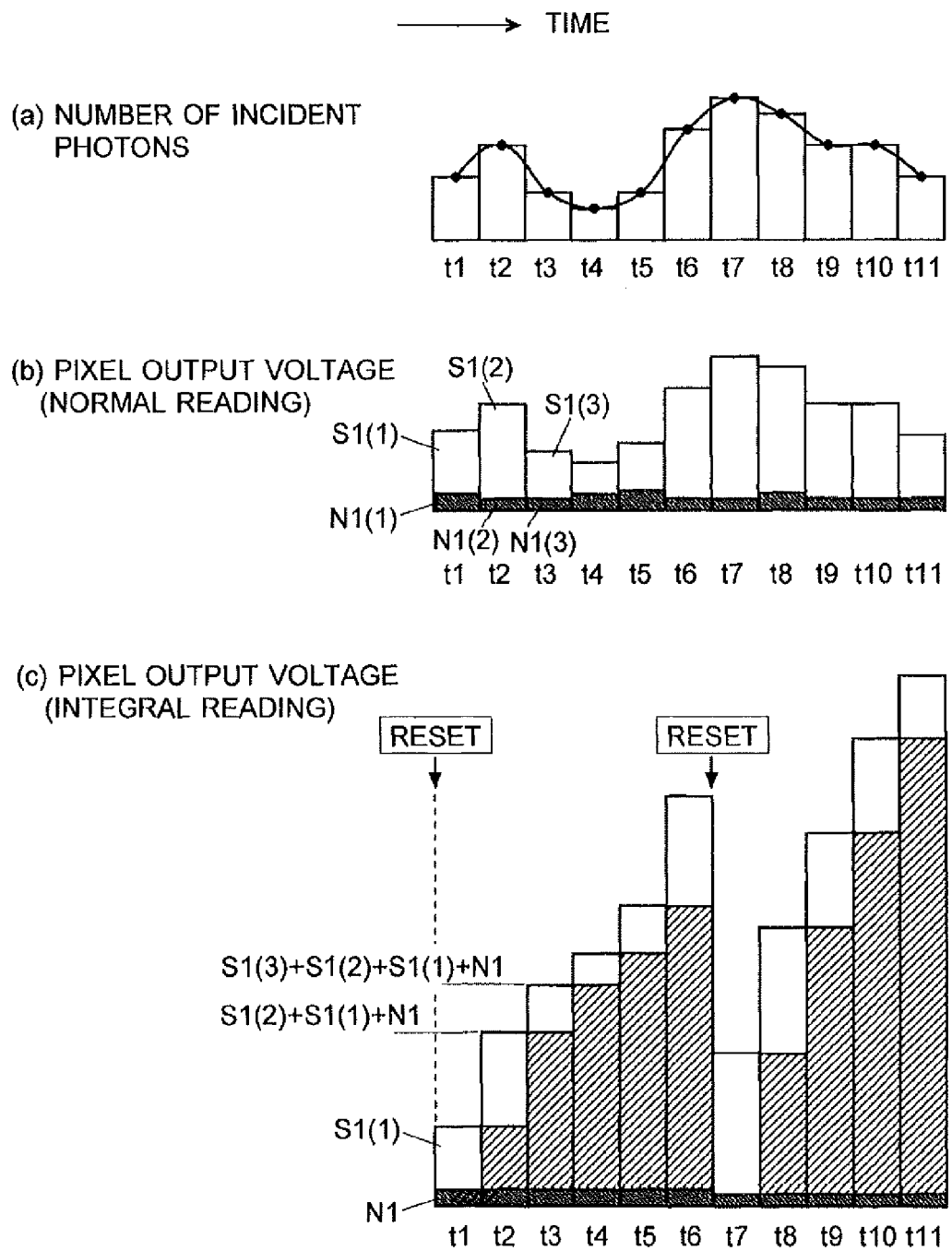
FIG. 14 is a conceptual operation diagram for explaining the difference between integral reading and normal reading of the solid-state image sensor according to still another embodiment (the third embodiment) of the present invention.

FIG. 14 is a conceptual operation diagram for explaining the difference between the integral reading and the normal reading described in the first embodiment. It is herein supposed that the number of incident photons falling onto the detection surface of the solid-state image sensor changes with time as shown in FIG. 14(a). In this figure, t1, t2 and t3 each denote one exposure cycle. In normal reading, as shown in FIG. 14(b), a pixel output voltage that corresponds to the number of photons received during one exposure cycle is obtained. As already explained, the pixel output signal obtained for each exposure cycle contains a signal S1 based on the photocharges and a noise signal N1. (It should be noted that the overflow of electric charges is disregarded in the present example and hence neither S2 nor N2 is present.) The level of signal S1 varies from one exposure cycle to the next, and the level of noise signal N1 also varies from one exposure cycle to the next. Accordingly, in the normal reading, the signal S1+N1 and the noise signal N1 are written to the capacitors in the memory unit 20 for each exposure cycle, after which the signal S1 is calculated by a subtracting operation.

On the other hand, in the integral reading, the voltage output corresponding to the number of incident photons is sequentially added and accumulated over a plurality of exposure cycles (six cycles in the case of FIG. 14) from when the floating diffusion 33 is reset to when it is reset next time. For example, the pixel output voltage written to the capacitor in the first exposure cycle after a resetting operation is S1(1)+N1, the pixel output voltage written to the capacitor in the next exposure cycle is S1(2)+S1(1)+N1, and the pixel output voltage written to the capacitor in the third exposure cycle is S1(3)+S1(2)+S1(1)+N1. That is to say, the signal S(n) in the $n^{th}$ exposure cycle after the resetting operation (where n is an integer within a range from 1 to 6) can be obtained by subtracting a pixel output voltage S1($n$−1)+ . . . +S1(1)+N1 from a pixel output voltage S1($n$)+S1($n$−1)+ . . . +S1(1)+N1.

Figure 15:
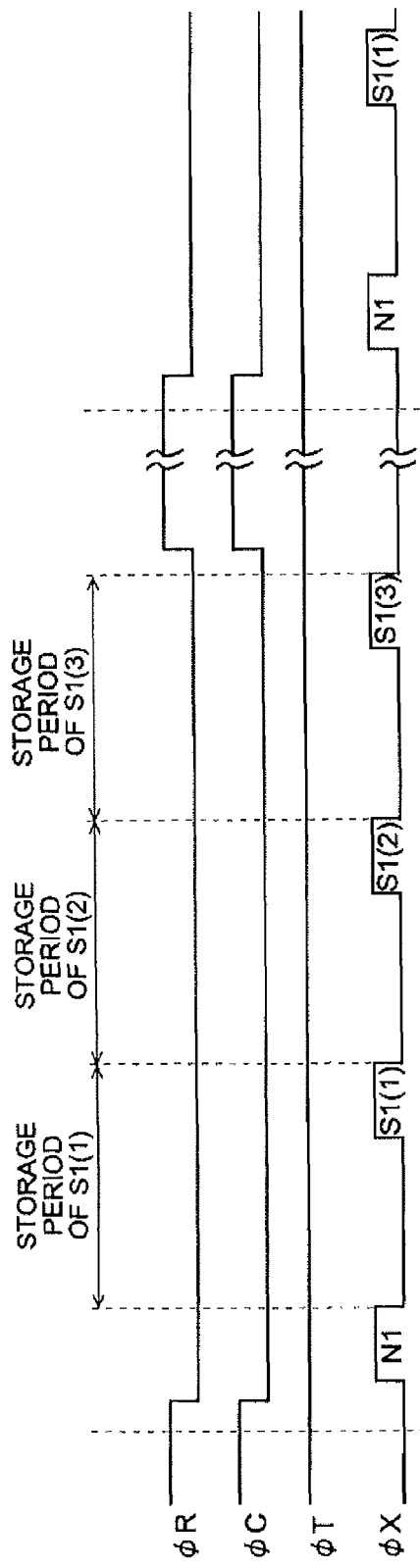
FIG. 15 is a drive timing chart during an integral reading operation of the solid-state image sensor of the third embodiment.

FIG. 15 is a drive timing chart during this integral imaging operation. It should be noted that, in this example, the number of exposure cycles over which the voltage signal is added and accumulated is three. The noise signal N1 mostly originates from a noise that occurs when the floating diffusion 33 is reset. Accordingly, after the noise signal N1 is written to one capacitor of the memory unit 20 immediately after the reset transistor 35 is changed from the ON state to the OFF state, only the normal signal S1 needs to be written to the capacitor of the memory unit 20 until the reset transistor 35 is turned on the next time. This means that it is unnecessary to provide a capacitor to which a noise signal is written for every exposure cycle. Therefore, the number of sampling transistors and capacitors required for the burst imaging of the same number of image frames can be significantly reduced as compared to the number required in the case of the normal reading. The magnitude of reduction in this number increases with an increase in the number of exposure cycles over which the voltage signal is added and accumulated.

It should be noted that, if the voltage signal accumulated in the floating diffusion 33 overflows, the resultant image will be incorrect. In view of this problem, the present method is usable in the case where the number of incident photons is relatively small (i.e. the light intensity is low). Alternatively, it is possible to perform a timing control in which the pixel output voltage is monitored with a circuit to reset the floating diffusion 33 before an overflow occurs.

As already explained, the signal corresponding to the number of photons received in each exposure cycle can be obtained by a subtracting operation of the pixel output signals. However, it is also possible to intentionally omit the subtracting operation and use the accumulated signals to reproduce images. For example, in the case of continuous high-speed imaging of a fast-moving object, the accumulated signals will reflect the movement locus of that object over a certain period of time. Such an image can be used, for example, for calculating the moving speed of the object.

It should be noted that the foregoing embodiments are mere examples of the solid-state image sensor according to the present invention; any change, modification or addition that is appropriately made within the spirit of the present invention naturally falls within the scope of claims of the present patent application.

EXPLANATION OF NUMERALS

1 . . . Semiconductor Substrate
2, 2a, 2b . . . Pixel Area
3a, 3b . . . Memory Area
4a, 4b . . . Vertical Scan Circuit Area
5a, 5b . . . Horizontal Scan Circuit Area
6a, 6b . . . Current Source Area
10, 10a, 10b . . . Pixel
11 . . . Photoelectric Conversion Area
12 . . . Pixel Circuit Area
13 . . . Wiring Area
14 . . . Pixel Output Line
15 . . . Drive Line
20, 20a, 20b . . . Memory Unit
21 . . . Writing-Side Transistor
22 . . . Reading-Side Transistor
23 . . . Signal Line
24, 24a . . . Memory section
25, 25001-25104, 25a-25d . . . Capacitor
26, 26001-26104, 26a-26d . . . Sampling Transistor
27 . . . Reading Buffer
31 . . . Photodiode (PD)
32 . . . Transfer Transistor
33 . . . Floating Diffusion (FD)
34 . . . Storage Transistor
35 . . . Reset Transistor
36 . . . Storage Capacitor
37, 40 . . . Transistor
38, 41 . . . Selection Transistor
39 . . . Current Source
42 . . . Output Line
43 . . . Source Follower Amplifier

The invention claimed is:

1. A solid-state image sensor, which is characterized by comprising in that the image sensor comprises:
   a) a pixel area in which a plurality of pixels are arranged, each pixel including a photoelectric conversion element for receiving light and generating photocharges, a transfer element for transferring the photocharges generated by the photoelectric conversion element to a detection node for converting a charge signal into a voltage signal and a buffer element for sending an output signal from the detection node to a below-mentioned pixel output line;
   b) a memory area, which is separated from the pixel area and includes as many memory units as the pixels, one memory unit being provided for each pixel and each memory unit including a plurality of memory sections, in order to hold signals produced by each pixel over a plurality of frames; and
   c) pixel output lines connecting the pixel area and the memory area, the number of the pixel output lines is obtained when the total number of pixels included in the pixel area is divided by n where n is an integer equal to or greater than two, and n pixels in the pixel area and n memory units in the memory area are connected to each of the pixel output lines, the n memory units being provided for the n pixels in order to hold signals produced by the n pixels over a plurality of frames,
   wherein the solid-state image sensor selects a mode ensuring a wide dynamic range by holding different analogue voltage signals transmitted from the same pixel during one exposure cycle in a plurality of memory sections, utilizing charges produced at the detection node before overflow and after overflow, and subjecting each of the analogue voltage signals to a subtracting operation after reading the analogue voltage signals, or another mode increasing a number of frames for bust imaging by utilizing some memory sections part of the plurality of the memory sections.

2. The solid-state image sensor according to claim 1, wherein the memory sections each include one capacitor and one switch element.

3. A solid-state image sensor comprising:
   a) a pixel area in which a plurality of pixels are arranged, each pixel including photoelectric conversion element for receiving light and generating photocharges, a transfer element for transferring the photocharges generated by the photoelectric conversion element to a detection node for converting a charge signal into a voltage signal and a buffer element for sending an output signal from the detection node to a below-mentioned pixel output line;
   b) a memory area, which is separated from the pixel area and includes as many memory units as the pixels, one memory unit being provided for each pixel and each memory unit including a plurality of memory sections, in order to hold signals produced by each pixel over a plurality of frames; and
   c) pixel output lines connecting the pixel area and the memory area, the number of the pixel output lines is obtained when the total number of pixels included in the pixel area is divided by n where n is an integer equal to or greater than two, and n pixels in the pixel area and n memory units in the memory area are connected to each of the pixel output lines, the n memory units being provided for the n pixels in order to hold signals produced by the n pixels over a plurality of frames;
   wherein a writing-side gate element and a reading-side gate element are provided on each of the pixel output lines, the writing-side gate element being located between the n pixels and the n memory units, and the reading-side gate element being located on the opposite side of the writing-side gate element with respect to the plurality of the memory sections.

4. The solid-state image sensor according to claim 3, wherein the pixels in the pixel area each include a reset element for resetting the photoelectric conversion element and the detection node.

5. The solid-state image sensor according to claim 4, wherein the photoelectric conversion element and the detection node are reset by the reset element every time a voltage signal stored in the detection node is outputted via the buffer element.

6. The solid-state image sensor according to claim 4, wherein after a voltage signal stored in the detection node at each pixel is outputted via the buffer element to the pixel output line, a voltage signal due to a photocharge generated by the photoelectric conversion element is stored in the detection node without resetting the photoelectric conversion element and the detection node, and the voltage signal is integrated during a series of exposure cycles and sequentially outputted to the pixel output line for each cycle.

7. The solid-state image sensor according to claim 5, wherein a writing operation of the memory sections is controlled so that each signal outputted to the pixel output line for each of exposure cycles at each of the pixels is sequentially held in each different one of the memory sections included in the memory unit corresponding to the pixel concerned.

8. The solid-state image sensor according to claim 7, wherein after the signals corresponding to a plurality of exposure cycles are stored in the memory sections included in one memory unit, a reading operation of each of the memory sections is controlled so as to sequentially read, through the reading-side gate element coupled to the pixel output line connected to the aforementioned one memory unit, the signals stored in the aforementioned memory sections over a plurality of frames.

9. A solid-state image sensor, comprising:
a) a pixel area in which a plurality of pixels are arranged, each pixel including photoelectric conversion element for receiving light and generating photocharges, a transfer element for transferring the photocharges generated by the photoelectric conversion element to a detection node for converting a charge signal into a voltage signal and a buffer element for sending an output signal from the detection node to a below-mentioned pixel output line;
b) a memory area, which is separated from the pixel area and includes as many memory units as the pixels, one memory unit being provided for each pixel and each memory unit including a plurality of memory sections, in order to hold signals produced by each pixel over a plurality of frames; and
c) pixel output lines connecting the pixel area and the memory area, the number of the pixel output lines is obtained when the total number of pixels included in the pixel area is divided by n where n is an integer equal to or greater than two, and n pixels in the pixel area and n memory units in the memory area are connected to each of the pixel output lines, the n memory units being provided for the n pixels in order to hold signals produced by the n pixels over a plurality of frames;
wherein the memory sections each include one capacitor and one switch element, and a writing-side gate element and a reading-side gate element are provided on each of the pixel output lines, the writing-side gate element being located between the n pixels and the n memory units, and the reading-side gate element being located on the opposite side of the writing-side gate element with respect to the plurality of the memory sections.

10. The solid-state image sensor according to claim 9, wherein the pixels in the pixel area each include a reset element for resetting the photoelectric conversion element and the detection node.

11. The solid-state image sensor according to claim 10, wherein the photoelectric conversion element and the detection node are reset by the reset element every time a voltage signal stored in the detection node is outputted via the buffer element.

12. The solid-state image sensor according to claim 10, wherein after a voltage signal stored in the detection node at each pixel is outputted via the buffer element to the pixel output line, a voltage signal due to a photocharge generated by the photoelectric conversion element is stored in the detection node without resetting the photoelectric conversion element and the detection node, and the voltage signal is integrated during a series of exposure cycles and sequentially outputted to the pixel output line for each cycle.

13. The solid-state image sensor according to claim 6, wherein a writing operation of the memory sections is controlled so that each signal outputted to the pixel output line for each of the exposure cycles at each of the pixels is sequentially held in each different one of the memory sections included in the memory unit corresponding to the pixel concerned.

14. The solid-state image sensor according to claim 11, wherein a writing operation of the memory sections is controlled so that each signal outputted to the pixel output line for each of the exposure cycles at each of the pixels is sequentially held in each different one of the memory sections included in the memory unit corresponding to the pixel concerned.

15. The solid-state image sensor according to claim 12, wherein a writing operation of the memory sections is controlled so that each signal outputted to the pixel output line for each of the exposure cycles at each of the pixels is sequentially held in each different one of the memory sections included in the memory unit corresponding to the pixel concerned.

16. The solid-state image sensor according to claim 13, wherein after the signals corresponding to a plurality of exposure cycles are stored in the memory sections included in one memory unit, a reading operation of each of the memory sections is controlled so as to sequentially read, through the reading-side gate element coupled to the pixel output line connected to the aforementioned one memory unit, the signals stored in the aforementioned memory sections over a plurality of frames.

17. The solid-state image sensor according to claim 14, wherein after the signals corresponding to a plurality of exposure cycles are stored in the memory sections included in one memory unit, a reading operation of each of the memory sections is controlled so as to sequentially read, through the reading-side gate element coupled to the pixel output line connected to the aforementioned one memory unit, the signals stored in the aforementioned memory sections over a plurality of frames.

18. The solid-state image sensor according to claim 15, wherein after the signals corresponding to a plurality of exposure cycles are stored in the memory sections included in one memory unit, a reading operation of each of the memory sections is controlled so as to sequentially read, through the reading-side gate element coupled to the pixel output line connected to the aforementioned one memory unit, the signals stored in the aforementioned memory sections over a plurality of frames.

* * * * *